(12) United States Patent
Kim et al.

(10) Patent No.: US 10,903,455 B2
(45) Date of Patent: Jan. 26, 2021

(54) ORGANIC LIGHT EMITTING DIODE DISPLAY DEVICE FOR IMPROVING LIGHT EXTRACTION EFFICIENCY OF PIXELS

(71) Applicant: LG Display Co., Ltd., Seoul (KR)

(72) Inventors: Soo-Kang Kim, Paju-si (KR);
Won-Hoe Koo, Goyang-si (KR);
Ji-Hyang Jang, Goyang-si (KR);
So-Young Jo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/672,476

(22) Filed: Nov. 3, 2019

(65) Prior Publication Data
US 2020/0083482 A1 Mar. 12, 2020

Related U.S. Application Data

(63) Continuation of application No. 16/023,106, filed on Jun. 29, 2018, now Pat. No. 10,522,789.

(30) Foreign Application Priority Data

Jun. 30, 2017 (KR) ......................... 10-2017-0083811

(51) Int. Cl.
*H01L 27/32* (2006.01)
*H01L 51/52* (2006.01)
(Continued)

(52) U.S. Cl.
CPC ........ *H01L 51/5271* (2013.01); *H01L 27/322* (2013.01); *H01L 27/3258* (2013.01);
(Continued)

(58) Field of Classification Search
USPC ...................................... 257/40; 438/88, 99
See application file for complete search history.

(56) References Cited

U.S. PATENT DOCUMENTS

2008/0024402 A1* 1/2008 Nishikawa ............. H05B 33/22
345/82
2008/0030833 A1* 2/2008 Park .................. G02F 1/133514
359/259
(Continued)

FOREIGN PATENT DOCUMENTS

| CN | 103904102 A | 7/2014 |
| KR | 2015-0077279 A | 7/2015 |
| KR | 2015-0121896 A | 10/2015 |

*Primary Examiner* — Didarul A Mazumder
(74) *Attorney, Agent, or Firm* — Polsinelli PC

(57) ABSTRACT

Disclosed is a light emitting display device which facilitates to improve light-extraction efficiency of pixels, and to maximize light-extraction efficiency of each pixel, wherein the light emitting display device includes a substrate having a first area and a second area, a planarization coating layer prepared on the substrate and configured to have a first curve pattern prepared on the first area, and a second curve pattern prepared on the second area, and an emission device prepared on the first curve pattern and the second curve pattern, wherein a thickness of the planarization coating layer overlapping the first curve pattern is different from a thickness of the planarization coating layer overlapping the second curve pattern, and each of the first curve pattern and the second curve pattern includes a plurality of protruding portions having an aspect ratio of 0.4~0.6.

20 Claims, 7 Drawing Sheets

(51) Int. Cl.
G09G 3/3258 (2016.01)
G09G 3/3266 (2016.01)
G09G 3/3275 (2016.01)
G09G 3/20 (2006.01)

(52) U.S. Cl.
CPC ...... *H01L 51/5209* (2013.01); *H01L 51/5225* (2013.01); *H01L 51/5262* (2013.01); *H01L 51/5281* (2013.01); *G09G 3/2003* (2013.01); *G09G 3/3258* (2013.01); *G09G 3/3266* (2013.01); *G09G 3/3275* (2013.01); *H01L 27/3213* (2013.01); *H01L 27/3272* (2013.01); *H01L 2251/558* (2013.01)

(56) References Cited

U.S. PATENT DOCUMENTS

| | | |
|---|---|---|
| 2014/0175399 A1 | 6/2014 | Choi et al. |
| 2017/0062769 A1 | 3/2017 | Kim et al. |
| 2017/0062770 A1 | 3/2017 | Jang et al. |
| 2017/0084676 A1 | 3/2017 | Jang et al. |
| 2017/0084875 A1 | 3/2017 | Joung et al. |
| 2017/0155094 A1 | 6/2017 | Joung et al. |

\* cited by examiner

ORGANIC LIGHT EMITTING DIODE DISPLAY DEVICE FOR IMPROVING LIGHT EXTRACTION EFFICIENCY OF PIXELS

CROSS REFERENCE TO RELATED APPLICATION

This application is a continuation of U.S. application Ser. No. 16/023,106, filed Jun. 29, 2018, which claims the benefit of the Korean Patent Application No. 10-2017-0083811 filed on Jun. 30, 2017, of which the full disclosures of these applications are incorporated herein by reference for all purposes.

BACKGROUND

Field of the Disclosure

The present disclosure relates to a light emitting display device.

Description of the Background

A light emitting display device is a self-light emitting display device, and may be fabricated at a lightweight and a slim size as it does not need a separate light source unlike a liquid crystal display device. Also, the light emitting display device is favorable in view of power consumption and also is excellent for a response speed, whereby the light emitting display device has been studied as a display for next generation.

The light emitting display device displays an image in accordance with a light emission of an emission device including an emission layer interposed between two electrodes. In this case, light generated by the light emission of the emission device is emitted to the external through the electrode and a substrate.

However, some of the light generated from the emission layer of the light emitting display device is not emitted to the external due to a total reflection on the interface between the emission layer and the electrode or the interface between the substrate and an air layer, to thereby lower a light-extraction efficiency. Accordingly, the low light-extraction efficiency causes lowering of luminance and increase of power consumption in the light emitting display device.

SUMMARY

Accordingly, aspects of the present disclosure are directed to a light emitting display device that substantially obviates one or more problems due to limitations and disadvantages of the related art, and a display apparatus comprising the same.

An aspect of the present disclosure is directed to provide a light emitting display device which facilitates to improve a light-extraction efficiency of pixels, and to maximize a light-extraction efficiency in each of the pixels.

Additional advantages and features of aspects of the disclosure will be set forth in part in the description which follows and in part will become apparent to those having ordinary skill in the art upon examination of the following or may be learned from practice of aspects of the disclosure. The objectives and other advantages of aspects of the disclosure may be realized and attained by the structure particularly pointed out in the written description and claims hereof as well as the appended drawings.

To achieve these and other advantages and in accordance with the purpose of aspects of the disclosure, as embodied and broadly described herein, there is provided a light emitting display device that may include a substrate having a first area and a second area, a planarization coating layer prepared on the substrate and configured to have a first curve pattern prepared on the first area, and a second curve pattern prepared on the second area, and an emission device prepared on the first curve pattern and the second curve pattern, wherein a thickness of the planarization coating layer overlapping the first curve pattern is different from a thickness of the planarization coating layer overlapping the second curve pattern, and each of the first curve pattern and the second curve pattern includes a plurality of protruding portions having an aspect ratio of 0.4~0.6.

It is to be understood that both the foregoing general description and the following detailed description of aspects of the present disclosure are exemplary and explanatory and are intended to provide further explanation of the disclosure as claimed.

BRIEF DESCRIPTION OF THE DRAWINGS

The accompanying drawings, which are included to provide a further understanding of aspects of the disclosure and are incorporated in and constitute a part of this application, illustrate aspect(s) of the disclosure and together with the description serve to explain the principle of aspects of the disclosure.

In the drawings.

DETAILED DESCRIPTION

Figure 1:
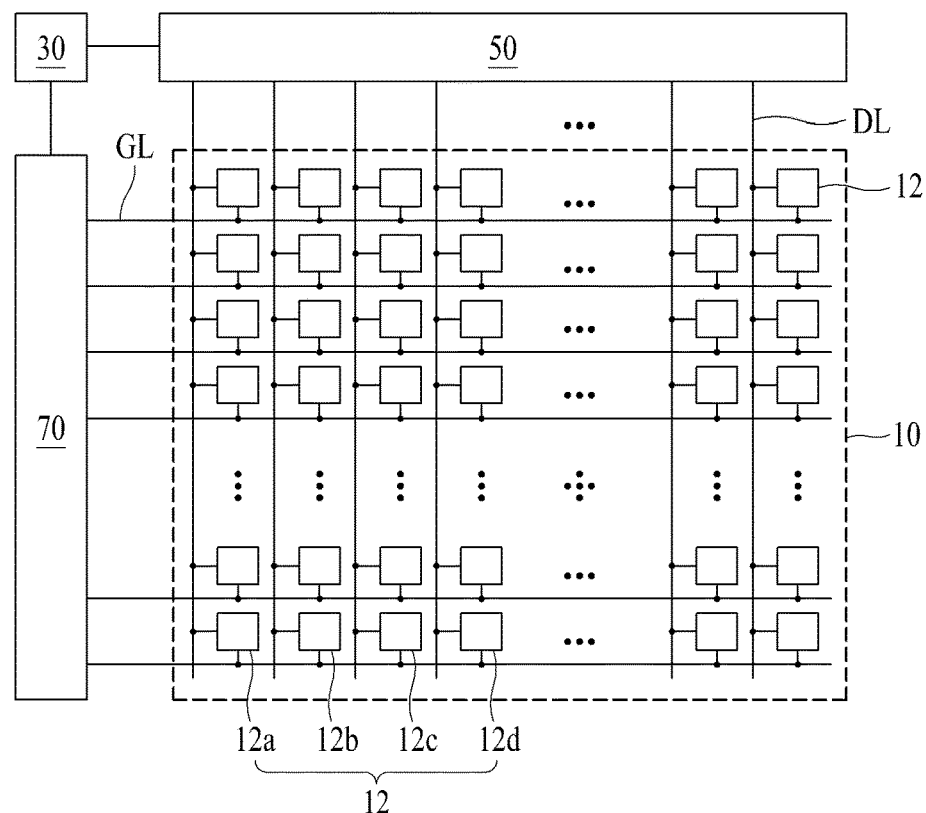
FIG. 1 illustrates a light emitting display device according to the aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present disclosure are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', a case which is not contact may be included unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, a light emitting display device according to the aspect of the present disclosure will be described in detail with reference to the accompanying drawings.

FIG. 1 illustrates a light emitting display device according to an aspect of the present disclosure.

Referring to FIG. 1, the light emitting display device according to an aspect of the present disclosure may include a pixel array portion 10, a control circuit 30, a data driving circuit 50 and a gate driving circuit 70.

The pixel array portion 10 may include a plurality of gate lines (GL) and a plurality of data lines (DL) prepared on a substrate, and a plurality of pixels 12a, 12b, 12c and 12d formed in respective pixel regions defined by crossing the plurality of gate lines (GL) and the plurality of data lines (DL).

Each of the plurality of pixels 12a, 12b, 12c and 12d displays an image in accordance with a gate signal supplied from the adjacent gate line (GL) and a data signal supplied from the adjacent data line (DL). Each of the plurality of pixels 12a, 12b, 12c and 12d includes a pixel circuit prepared in the pixel region defined by the gate line (GL) and the data line (DL), and an emission device connected with the pixel circuit. Each of the pixels 12a, 12b, 12c and 12d may include at least two thin film transistors and at least one capacitor. Each of the pixels 12a, 12b, 12c and 12d may include a self light emitting device which emits light in itself so as to display an image in accordance with the data signal supplied from the pixel circuit. Herein, the self light emitting device may be an organic light emitting device, a quantum dot light emitting device or an inorganic light emitting device.

Each of the plurality of pixels 12a, 12b, 12c and 12d may be defined as a minimum unit area for emitting virtual light, which may be expressed as a sub pixel. At least four adjacent pixels 12a, 12b, 12c and 12d may constitute one unit pixel 12 for displaying a color image. According to one aspect, one unit pixel 12 may include the first to fourth pixels 12a, 12b, 12c and 12d arranged adjacent to each other along a length direction of the gate line (GL). According to another aspect, one unit pixel 12 may include the first to fourth pixels 12a, 12b, 12c and 12d arranged adjacent to each other along a length direction of the data line (DL). In case of this unit pixel 12, the number of gate lines (GL) connected with the gate driving circuit 70 having a relatively simplified circuit structure is increased, however, the number of data lines (DL) connected with the data driving circuit 50 having a relatively complex circuit structure is decreased. According to another aspect, one unit pixel 12 may include the first to fourth pixels 12a, 12b, 12c and 12d arranged adjacent to each other along the gate line (GL) and the data line (DL). Herein, the first pixel 12a may be a red pixel, the second pixel 12b may be a green pixel, the third pixel 12c may be a blue pixel, and the fourth pixel 12d may be a white pixel.

The control circuit 30 generates pixel data for each pixel corresponding to each of the plurality of pixels 12a, 12b, 12c and 12d on the basis of data signal. For example, the control circuit 30 extracts white pixel data based on an image signal, that is, red input data, green input data and blue input data of each unit pixel 12, calculates red pixel data, green pixel data and blue pixel data by subtracting white pixel data from each of the red input data, the green input data and the blue input data, aligns the calculated red pixel data, green pixel data, blue pixel data and white pixel data in accordance with a pixel arrangement structure, and supplies the aligned data to the data driving circuit 50.

The control circuit 30 generates a data control signal based on a timing synchronization signal, and provides the data control signal to the data driving circuit 50. The control circuit 30 generates a gate control signal including a start signal and a plurality of gate clock signals on the basis of timing synchronization signal, and provides the gate control signal to the gate driving circuit 70.

The data driving circuit 50 is connected with the plurality of data lines (DL) prepared in the pixel array portion 10. The data driving circuit 50 receives the data control signal and the pixel data for each pixel supplied from the control circuit 30, and receives a plurality of reference gamma voltages supplied from a power source circuit. The data driving circuit 50 converts the pixel data for each pixel into an analog pixel data signal of an analog type by the use of the data control signal and the plurality of reference gamma voltages, and supplies the analog pixel data signal to the corresponding data line (DL).

The gate driving circuit 70 is connected with the plurality of gate lines (GL) prepared in the pixel array portion 10. The gate driving circuit 70 generates the gate signal in accordance with a preset order based on the gate control signal supplied from the control circuit 30, and supplies the gate signal to the corresponding gate line (GL).

The gate driving circuit 70 according to one aspect of the present disclosure may be integrated with one edge or both edges of the substrate in accordance with a manufacturing process of the thin film transistor, and may be connected with the plurality of gate lines (GL) by an one-to-one correspondence. The gate driving circuit 70 according to one aspect of the present disclosure may be formed in an integrated circuit, may be provided on the substrate or a flexible circuit film, and may be connected with the plurality of gate lines (GL) by an one-to-one correspondence.

Figure 2:
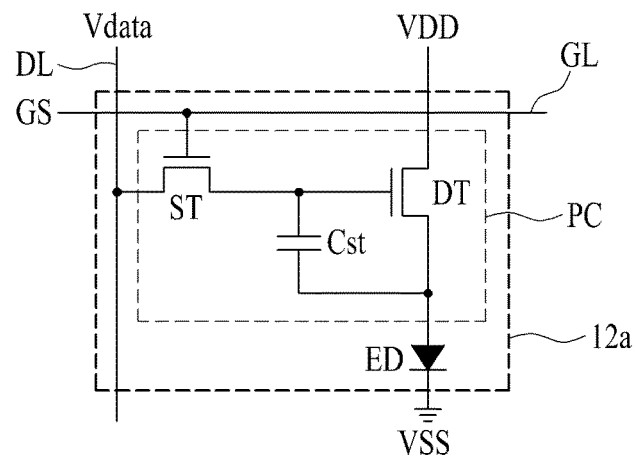
FIG. 2 is an equivalent circuit diagram of a first pixel shown in FIG. 1.

FIG. 2 is an equivalent circuit diagram of the first pixel shown in FIG. 1.

Referring to FIG. 2, the first pixel 12a of the light emitting display device according to the aspect of the present disclosure includes the pixel circuit (PC) and the emission device (ED).

The pixel circuit (PC) is prepared in a circuit area of the pixel region defined by the gate line (GL) and the data line (DL), and is connected with the adjacent gate line (GL) and data line (DL), and a first driving power source (VDD). The pixel circuit (PC) controls a light emission of the emission device (ED) in accordance with a data voltage (Vdata) supplied from the data line (DL) in response to a gate-on signal (GS) supplied from the gate line (GL). The pixel circuit (PC) according to one aspect of the present disclosure may include a switching thin film transistor (ST), a driving thin film transistor (DT) and a capacitor (Cst).

The switching thin film transistor (ST) may include a gate electrode connected with the gate line (GL), a first source/drain electrode connected with the data line (DL), and a second source/drain electrode connected with a gate electrode of the driving thin film transistor (DT). The switching thin film transistor (ST) is turned-on by the gate-on signal (GS) supplied to the gate line (GL), whereby the data voltage (Vdata) supplied to the data line (DL) is supplied to the gate electrode of the driving thin film transistor (DT).

The driving thin film transistor (DT) may include a gate electrode connected with the second source/drain electrode of the switching thin film transistor (ST), a first source/drain electrode (or drain electrode) connected with the first driving power source (VDD), and a second source/drain (or source electrode) connected with the emission device (ED). The driving thin film transistor (DT) is turned-on by a gate-source voltage based on the data voltage (Vdata) supplied from the switching thin film transistor (ST), whereby the driving thin film transistor (DT) controls the data signal supplied from the first driving power source (VDD) to the emission device (ED).

The capacitor (Cst) is connected between the gate electrode and the source electrode of the driving thin film transistor (DT). The capacitor (Cst) stores a voltage corresponding to the data voltage (Vdata) supplied to the gate electrode of the driving thin film transistor (DT), and turns on the driving thin film transistor (DT) by the stored voltage. In this case, the capacitor (Cst) maintains the turn-on state of the driving thin film transistor (DT) until when the data voltage (Vdata) is supplied to the next frame through the switching thin film transistor (ST).

The emission device (ED) is prepared in an emission area of the pixel region, wherein the emission device (ED) emits light in accordance with the data signal supplied from the pixel circuit (PC). According to one aspect of the present disclosure, the emission device (ED) may include a first electrode connected with the source electrode of the driving thin film transistor (DT), a second electrode connected with a second driving power source (VSS), and an emission layer prepared between the first electrode and the second electrode. Herein, the emission layer may include any one among an organic light emitting layer, an inorganic light emitting layer and a quantum dot light emitting layer, or may include a deposition structure or combined structure of the organic light emitting layer (or inorganic light emitting layer) and the quantum dot light emitting layer.

The first pixel 12a of the light emitting display device according to the aspect of the present disclosure controls the data signal supplied to the emission device (ED) in accordance with the gate-source voltage of the driving thin film transistor (DT), and makes the emission device (ED) emit light, to thereby display a predetermined image. In the same manner, a structure in each of the second to fourth pixels 12b, 12c and 12d is the same as a structure of the first pixel 12a.

Figure 3:
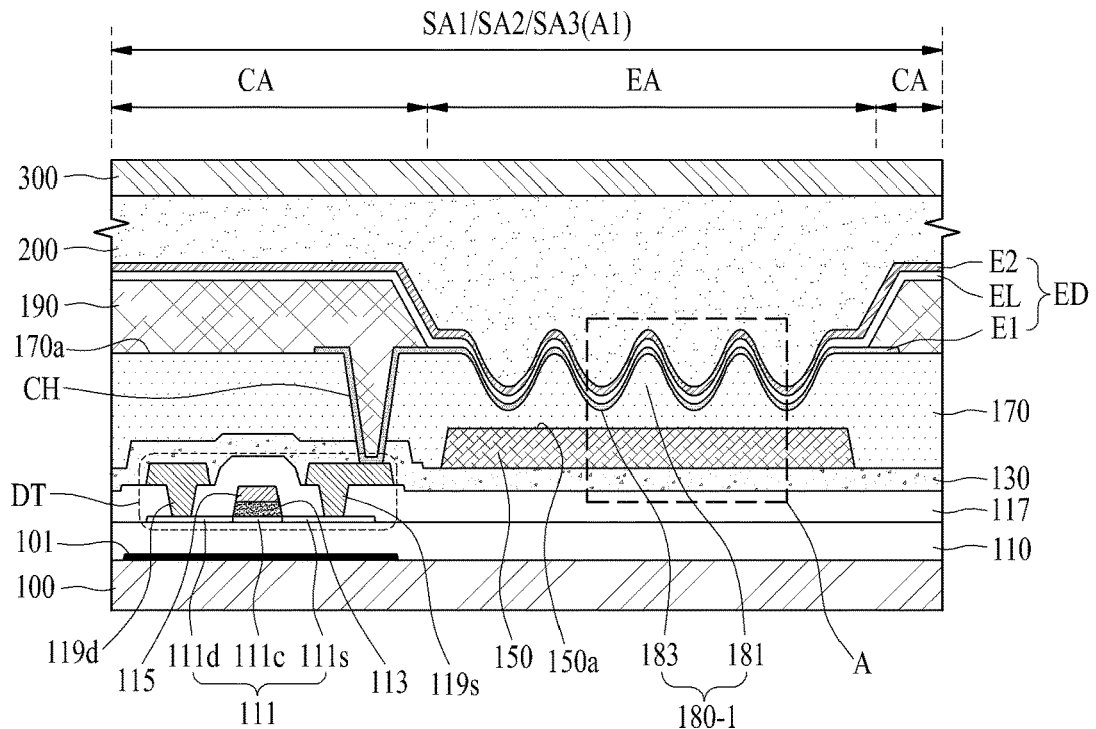
FIG. 3 is a cross-sectional view illustrating a structure of each of first to third pixels shown in FIG. 1.
Figure 4:
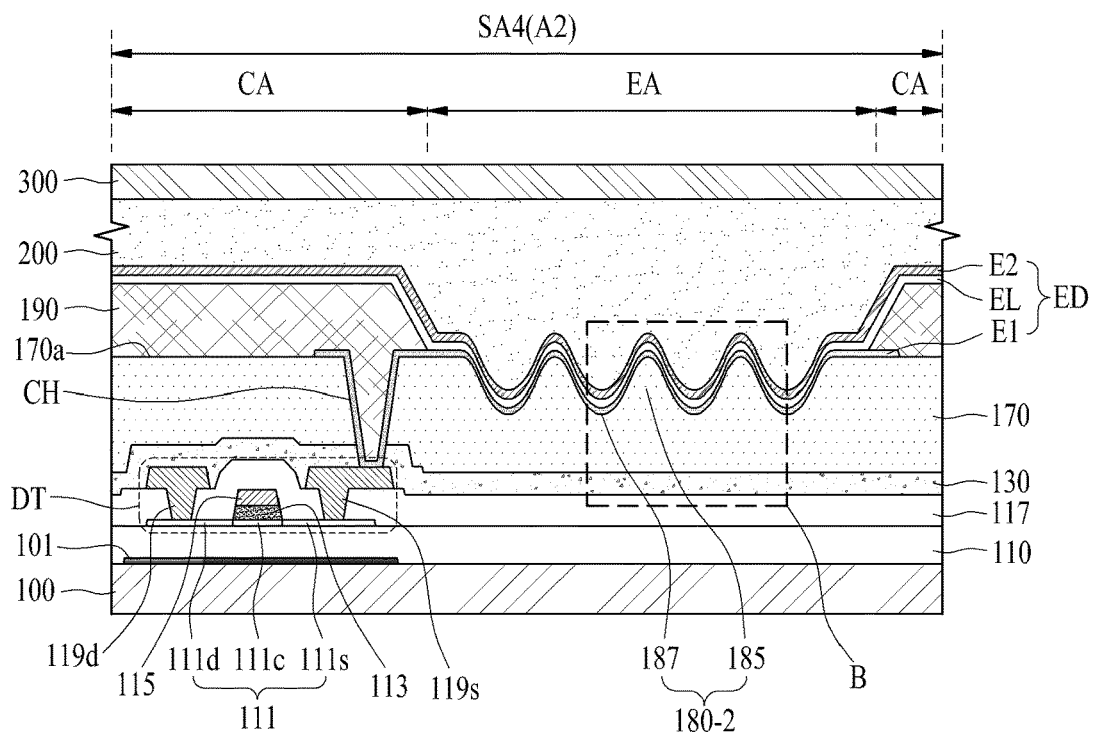
FIG. 4 is a cross-sectional view illustrating a structure of a fourth pixel shown in FIG. 1.

FIG. 3 is a cross-sectional view illustrating a structure of each of the first to third pixels shown in FIG. 1. FIG. 4 is a cross-sectional view illustrating a structure of the fourth pixel shown in FIG. 1.

Referring to FIGS. 3 and 4 in connection with FIG. 1, the light emitting display device according to the present disclosure may include a substrate 100, a transistor layer, a color filter layer 150, a planarization coating layer 170 and an emission device (ED).

Generally, the substrate 100 may be formed of a glass material. The substrate 100 may be formed of a transparent plastic material capable of being bent or curved, for example, polyimide material. If using the plastic material, the substrate 100 may be formed of polyimide with great thermal resistance, which may be durable at a high temperature, due to a high-temperature deposition process performed on the substrate 100. An entire front surface of the substrate 100 may be covered with at least one buffer layer 110.

The buffer layer 110 prevents materials contained in the substrate 100 from being diffused to the transistor layer for the high-temperature process of the manufacturing process for the thin film transistor. Also, the buffer layer 110 prevents water or moisture from being permeated into the emission device (ED). The buffer layer 110 may be formed of a silicon oxide or a silicon nitride. Selectively, it is possible to omit the buffer layer 110.

The substrate 100 may include a display area, and a non-display area surrounding the display area.

The display area may include a plurality of unit pixel regions having a first area (A1) and a second area (A2) adjacent to the first area (A1).

The first area (A1) includes first to third sub areas (SA1, SA2, SA3) in which the first to third pixels 12a, 12b and 12c are respectively prepared. The first pixel 12a is prepared on the first sub area (SA1), the second pixel 12b is prepared on the second sub area (SA2), and the third pixel 12c is prepared on the third sub area (SA3). Each of the first to third sub areas (SA1, SA2, and SA3) includes a circuit area (CA) and an emission area (EA, or opening area).

The second area (A2) includes a fourth sub area (SA4) provided with the fourth pixel 12d.

Each of the first to fourth sub areas (SA1, SA2, SA3, and SA4) includes a circuit area (CA) and an emission area (EA).

The transistor layer may include the driving thin film transistor (DT) prepared in the circuit area (CA) defined in each of the first to fourth sub areas (SA1, SA2, SA3, and SA4).

The driving thin film transistor (DT) according to one aspect of the present disclosure includes an active layer 111, a gate insulating film 113, a gate electrode 115, a passivation layer 117, a drain electrode 119d and a source electrode 119s.

The active layer 111 includes drain and source regions 111d and 111s, and a channel region 111c formed in a driving thin film transistor area of the circuit area (CA) defined on the substrate 100 or buffer layer 110. The active layer 111 may include the drain region 111d and the source region 111s which become conductors by an etching gas of an etching process, and the channel region 111c which does not become a conductor. In this case, the drain region 111d and the source region 111s are parallel to each other while the channel region 111c is interposed between the drain region 111d and the source region 111s.

The active layer 111 according to one aspect of the present disclosure may be formed of a semiconductor material corresponding to any one among amorphous silicon, polycrystalline silicon, oxide and organic material, but not limited to these materials. For example, the active layer 111 according to the present disclosure may be formed of an oxide material such as zinc oxide, tin oxide, Ga—In—Zn oxide, In—Zn oxide or In—Sn oxide, or may be formed of an oxide material doped with ions such as Al, Ni, Cu, Ta, Mo, Zr, V, Hf and Ti.

The gate insulating film 113 is formed on the channel region 111c of the active layer 111. The gate insulating film 113 is not formed on an entire front surface of the buffer layer 110 or the substrate 100 including the active layer 111, but formed in an island shape only on the channel region 111c of the active layer 111.

The gate electrode 115 is formed on the gate insulating film 113 while being overlapping the channel region 111c of the active layer 111. The gate electrode 115 functions as a mask so as to prevent the channel region of the active layer 111 from being a conductor by the etching gas used for a process of patterning the gate insulating film 113 by the use of etching process. The gate electrode 15 may be formed in a single-layered structure of one of molybdenum (Mo), aluminum (Al), chrome (Cr), aurum (Au), titanium (Ti), nickel (Ni), neodymium (Nd), copper (Cu), and their alloys, or may be formed in a multi-layered structure of one of molybdenum (Mo), aluminum (Al), chrome (Cr), aurum (Au), titanium (Ti), nickel (Ni), neodymium (Nd), copper (Cu), and their alloys.

The passivation layer 117 is formed on the gate electrode 115, and the drain region 111d and the source region 111s of the active layer 111. That is, the passivation layer 117 is formed on the entire front surface of the buffer layer 110 or the substrate 100, to thereby cover the gate electrode 115, and the drain region 111d and the source region 111s of the active layer 111. The passivation layer 117 may be formed of an inorganic material such as silicon oxide (SiOx) or silicon nitride (SiNx), or may be formed of an organic material such as benzocyclobutene or photo-acryl. Selectively, the passivation layer 117 may be expressed by the term such as an insulating interlayer.

The drain electrode 119d is electrically connected with the drain region 111d of the active layer 111 via a first contact hole prepared in the passivation layer 117 overlapping the drain region 111d of the active layer 111.

The source electrode 119s is electrically connected with the source region 111s of the active layer 111 via a second contact hole prepared in the passivation layer 117 overlapping the source region 111s of the active layer 111.

The drain electrode 119d and the source electrode 119s may be formed of the same metal materials. For example, each of the drain electrode 119d and the source electrode 119s may be formed in a single-layered structure of any one selected among molybdenum (Mo), aluminum (Al), chrome (Cr), aurum (Au), titanium (Ti), nickel (Ni), neodymium (Nd), copper (Cu), and their alloys, or may be formed in a multi-layered structure of one of molybdenum (Mo), aluminum (Al), chrome (Cr), aurum (Au), titanium (Ti), nickel (Ni), neodymium (Nd), copper (Cu), and their alloys.

Additionally, the circuit area may further include a switching thin film transistor and a capacitor.

The switching thin film transistor is identical in structure to the driving thin film transistor, and the switching thin film transistor is prepared on the circuit area (CA), whereby a detailed description for the switching thin film transistor will be omitted.

The capacitor is prepared in an overlapping area between the source electrode 119s and the gate electrode 115 of the driving thin film transistor (DT) which overlapping each other under the circumstances that the passivation layer 117 is interposed in-between.

Additionally, in case of a transistor prepared in the circuit area (CA), its threshold voltage may be shifted by light. In order to prevent this phenomenon, the light emitting display device according to the present disclosure may further include a light shielding layer 101 prepared under the active layer 111.

The light shielding layer 101 is prepared between the substrate 100 and the active layer 111 so that it is possible to block the light which is incident on the active layer 111 through the substrate 100, to thereby prevent or minimize the change of threshold voltage in the transistor caused by the ambient light. The light shielding layer 101 is covered by the buffer layer 110. Selectively, the light shielding layer 101 is electrically connected with the source electrode of the transistor, whereby the light shielding layer 101 may serve as a lower gate electrode of the corresponding transistor. In this case, it is possible to prevent or minimize the change of threshold voltage of the transistor in accordance with a bias voltage as well as the characteristic change caused by the light.

The insulating layer 130 is prepared on the entire area of the substrate 100 so as to cover the transistor layer. That is, the insulating layer 130 covers the passivation layer 170 and the drain electrode 119d and the source electrode 119s of the driving thin film transistor (DT). The insulating layer 130 according to one aspect of the present disclosure may be formed of an inorganic material such as silicon oxide (SiOx) and silicon nitride (SiNx). Selectively, the insulating layer 130 may be expressed by the term such as a passivation layer.

The color filter layer 150 is prepared on the insulating layer 130 overlapping the emission area (EA) of the first area (A1). That is, the color filter layer 150 is prepared in an island shape on the insulating layer 130 overlapping the emission area (EA) in each of the first to third sub areas (SA1, SA2, and SA3). The color filter layer 150 changes white light, which is emitted from the emission device (ED)

to the substrate 100, into colored light which has a color preset in the corresponding pixel.

The color filter layer 150 according to one aspect of the present disclosure includes a color filter which transmits only the wavelength of light preset in the corresponding pixel from the white light emitted from the emission device (ED) to the substrate 100. For example, the color filter layer 150 may include a red color filter prepared on the emission area (EA) of the first sub area (SA1, or first pixel), a green color filter prepared on the emission area (EA) of the second sub area (SA2, or second pixel), and a blue color filter prepared on the emission area (EA) of the third sub area (SA3, or third pixel).

The color filter layer 150 according to another aspect of the present disclosure includes a quantum dot layer having a size capable of emitting the light preset in the corresponding pixel through the use of re-emission in accordance with the white light emitted from the emission device (ED) to the substrate 100. In this case, the quantum dot layer may include a quantum dot formed of one of Cds, CdSe, CdTe, ZnS, ZnSe, GaAs, GaP, GaAs—P, Ga—Sb, InAs, InP, InSb, AlAs, AlP or AlSb. For example, the quantum dot layer prepared on the emission area (EA) of the first sub area (SA1, or first pixel) may include the quantum dot of CdSe or InP, the quantum dot layer prepared on the emission area (EA) of the second sub area (SA2, or second pixel) may include the quantum dot of CdZnSeS, and the quantum dot layer prepared on the emission area (EA) of the third sub area (SA3, or third pixel) may include the quantum dot of ZnSe. If the color filter layer 150 is formed of the quantum dot layer, it is possible to realize the light emitting display device with great color realization.

The color filter layer 150 according to another aspect of the present disclosure may include a color filter containing a quantum dot.

Meanwhile, the color filter layer 150 is not formed in the second area (A2), that is, the fourth sub area (SA4). That is, the fourth pixel 12d corresponds to an additionally-provided white sub pixel so as to improve white luminance of the unit pixel 12. Unlike the first to third pixels 12a, 12b and 12c, the fourth pixel 12d does not require the color filter layer 150. Thus, the color filter layer 150 is not disposed in the fourth pixel 12d.

The planarization coating layer 170 is prepared on the entire area of the substrate 100 so as to cover the insulating layer 130 and the color filter layer 150. The planarization coating layer 170 has a relatively large thickness so that it is possible to provide a planarization surface on the substrate 100. The planarization coating layer 170 according to one aspect of the present disclosure may be formed of an organic material such as photo-acryl, benzocyclobutene, polyimide and fluorine resin.

The planarization coating layer 170 according to the present disclosure may include a flat surface, a first curve pattern 180-1 and a second curve pattern 180-2.

The flat surface is prepared on the front surface (or upper surface) 170a of the planarization coating layer 170 for covering the remaining circuit area (CA) except the emission area (EA) in the first area (A1) and the second area (A2).

The first curve pattern 180-1 is prepared in the first area (A1), that is, the front surface of the planarization coating layer 170 prepared in the emission area (EA) of each of the first to third sub areas (SA1, SA2, and SA3).

The first curve pattern 180-1 has a curved (or uneven) pattern in the planarization coating layer 170 overlapping the emission area (EA) of the corresponding pixel so that it is possible to change a traveling path of the light emitted from the emission device (ED), to thereby improve light-extraction efficiency of the pixel. In this case, the first curve pattern 180-1 is prepared to cover the color filter layer 150 so that a thickness of the planarization coating layer 170 overlapping the first curve pattern 180-1 is relatively smaller than a thickness of the planarization coating layer 170 overlapping the circuit area (CA).

The first curve pattern 180-1 according to one aspect of the present disclosure includes a plurality of first protruding portions 181 and a plurality of first recess portions 183 prepared between the emission device (ED) and the color filter layer 150.

Each of the plurality of first protruding portions 181 is prepared in the planarization coating layer 170 on the emission area (EA) overlapping the color filter layer 150. The plurality of first protruding portions 181 change the traveling path of the light emitted from the emission device (ED) toward the substrate 100 so that it is possible to improve light-extraction efficiency of the light emitted from the emission device (ED) prepared in the corresponding pixel. To this end, the plurality of first protruding portions 181 may have the aspect ratio of 0.4 to 0.6. Herein, the aspect ratio in the plurality of protruding portions 181 indicates the ratio of half-width (or radius) to the height (H1) in the plurality of protruding portions 181. The plurality of first protruding portions 181 will be described in detail later.

Each of the plurality of first recess portions 183 is prepared in the front surface 170a of the planarization coating layer 170. That is, each of the plurality of first recess portions 183 may be provided between the plurality of first protruding portions 181 or may be surrounded by the plurality of first protruding portions 181. With respect to the front surface 170a of the planarization coating layer 170, the plurality of first recess portions 183 may have the same depth. However, some among the plurality of first recess portions 183 may have the different depths due to a manufacturing error for a process of patterning the first curve pattern 180-1.

A bottom surface (or lowermost surface) in each of the plurality of first recess portions 183 is provided at a predetermined interval from the color filter layer 150. In order to prevent the front surface of the color filter layer 150 from being directly exposed to the first recess portion 183 by the depth of the first recess portion 183, a minimum distance between the bottom surface of the first recess portion 183 and the color filter layer 150 is set within a range of 0.1 to 3 micrometer (μm). In this case, the planarization coating layer 170 prepared between the color filter layer 150 and the bottom surface of the first recess portion 183 has the thickness of 0.1 to 3 micrometer (μm).

The second curve pattern 180-2 is prepared in the second area (A2), that is, the front surface of the planarization coating layer 170 prepared in the emission area (EA) of the fourth sub area (SA4).

The second curve pattern 180-2 has a curved (or uneven) pattern in the planarization coating layer 170 overlapping the emission area (EA) of the fourth pixel so that it is possible to change a traveling path of the light emitted from the emission device (ED), to thereby improve light-extraction efficiency of the pixel. In this case, the second curve pattern 180-2 is prepared to cover the insulating layer 130 overlapping the emission area (EA) of the fourth sub area (SA4) so that the thickness of the planarization coating layer 170 overlapping the second curve pattern 180-2 is relatively larger than the thickness of the planarization coating layer 170 overlapping the first curve pattern 180-1 of the first area (A1). Accordingly, the thickness of the planarization coating layer 170 prepared between the color filter layer 150 and the bottom surface of the first curve pattern 180-1 may be smaller than the thickness of the planarization coating layer 170 prepared between the substrate 100 and the bottom surface of the second curve pattern 180-2.

The second curve pattern 180-2 according to one aspect of the present disclosure includes a plurality of second protruding portions 185 and a plurality of second recess portions 187.

Each of the plurality of second protruding portions 185 is prepared in the planarization coating layer 170 on the emission area (EA) overlapping the fourth sub area (SA4). The plurality of second protruding portions 185 change the traveling path of the light emitted from the emission device (ED) toward the substrate 100 so that it is possible to improve light-extraction efficiency of the light emitted from the emission device (ED) prepared in the fourth pixel. Each of the plurality of second protruding portions 185 may be identical in shape to each of the plurality of first protruding portions 181 prepared in the first area (A1). Within a manufacturing error for a patterning process, each of the plurality of second protruding portions 185 may be different in shape from each of the plurality of first protruding portions 181 prepared in the first area (A1). In detail, the plurality of second protruding portions 185 may have the aspect ratio of 0.4 to 0.6. The plurality of second protruding portions 185 will be described in detail later.

Each of the plurality of second recess portions 187 is formed in the recess shape from the front surface 170a of the planarization coating layer 170. That is, each of the plurality of second recess portions 187 may be provided between the plurality of second protruding portions 185 or may be surrounded by the plurality of second protruding portions 185. With respect to the front surface 170a of the planarization coating layer 170, the plurality of second recess portions 187 may have the same depth. However, some among the plurality of second recess portions 187 may have the different depths due to a manufacturing error for a process of patterning the second curve pattern 180-2.

The emission device (ED) emits the light toward the substrate 100 in accordance with a bottom emission type. The emission device (ED) according to one aspect of the present disclosure includes a first electrode (E1), an emission layer (EL) and a second electrode (E2).

The first electrode (E1) is formed in an island shape on the first curve pattern 180-1 prepared in the emission area (EA) of each sub area (SA1, SA2, SA3, and SA4), and is electrically connected with the source electrode 119s of the driving thin film transistor (DT). In this case, one end of the first electrode (E1) adjacent to the circuit area (CA) extends to the source electrode 119s of the driving thin film transistor (DT), and then is electrically connected with the source electrode 119s of the driving thin film transistor (DT) via a contact hole (CH) prepared in the planarization coating layer 170 and the insulating layer 130. As the first electrode (E1) is in the direct contact with the first curve pattern 180-1, the first electrode (E1) includes the curve pattern having the shape in accordance with the shape of the first curve pattern 180-1.

The first electrode (E1) may be an anode electrode of the emission device (ED). The first electrode (E1) according to one aspect of the present disclosure may be formed of transparent conductive oxide (TCO) capable of transmitting the light which is emitted from the emission layer (EL) to the substrate 100, for example, indium tin oxide (ITO) or indium zinc oxide (IZO).

The emission layer (EL) is formed in the entire area of the first area (A1) and the second area (A2), and is electrically connected with the first electrode (E1). In this case, as the emission layer (EL) overlapping the emission area (EA) of each sub area (SA1, SA2, SA3, and SA4) is in the direct contact with the front surface of the first electrode (E1), the emission layer (EL) includes the curve pattern having the shape in accordance with the shape of the front surface in the first electrode (E1). Thus, the emission layer (EL) overlapping the emission area (EA) of each sub area (SA1, SA2, SA3, SA4) includes the curve pattern having the shape in accordance with the shape of the first curve pattern 180-1.

The emission layer (EL) according to one aspect of the present disclosure includes two or more emission portions for emitting white light. For example, the emission layer (EL) may include first and second emission portions for emitting white light by mixing first light and second light together. Herein, the first emission portion is provided to emit the first light, wherein the first emission portion may be any one among blue, green, red, yellow and yellowish green emission portions. The second emission portion may include an emission portion for emitting light whose color is complementary to that of the first light among the blue, green, red, yellow and yellowish green colors.

The second electrode (E2) is formed on the emission layer (EL), and is electrically connected with the emission layer (EL). In this case, as the second electrode (E2) overlapping the emission area (EA) of each sub area (SA1, SA2, SA3, and SA4) is in the direct contact with the front surface of the emission layer (EL), the second electrode (E2) includes the curve pattern having the shape in accordance with the shape of the front surface in the emission layer (EL). Thus, the second electrode (E2) overlapping the emission area (EA) of each sub area (SA1, SA2, SA3, and SA4) includes the curve pattern having the shape in accordance with the shape of the first curve pattern 180-1.

The second electrode (E2) according to one aspect of the present disclosure may be a cathode electrode of the emission device (ED). The second electrode (E2) according to one aspect of the present disclosure may include a metal material with high reflectance so as to reflect the light, which is emitted from the emission layer (EL), to the substrate 100. For example, the second electrode (E2) may be formed in a multi-layered structure, for example, a deposition structure (Ti/Al/Ti) of aluminum and titanium, a deposition structure (ITO/Al/ITO) of aluminum and ITO, APC alloy (Ag/Pd/Cu) or a deposition structure (ITO/APC/ITO) of APC alloy and ITO, or may be formed in a single-layered structure of any one material or an alloy of two or more materials from one of argentums (Ag), aluminum (Al), molybdenum (Mo), aurum (Au), magnesium (Mg), calcium (Ca) or barium (Ba).

The emission device (ED) emits white light by the light emission of the emission layer (EL) in accordance with the data signal supplied to the first electrode (E1). In this case, the emission device (ED) provided on the emission area (EA) has the shape corresponding to the shape of the curve pattern 180-1 and 180-2. Thus, in case of the light which is incident less than a total-reflection critical angle in the white light which is incident on the interfacial surface between the first electrode (E1) and the curve pattern 180-1 and 180-2, it is intactly extracted toward the substrate 100. Meanwhile, in case of the light which is incident more than the total-reflection critical angle, its traveling path is changed by the protruding portion 181 and 185 and the recess portion 183 and 187 of the curve pattern 180-1 and 180-2, whereby the light is extracted toward the substrate 100. Accordingly, it is possible to improve the light extraction efficiency in each pixel.

The light emitting display device according to the present disclosure may further include a bank layer 190 and an encapsulation layer 200.

The bank layer 190 is provided to define the emission area (EA) of each sub area (SA1, SA2, SA3, and SA4) prepared in the first area (A1) and the second area (A2). The bank layer 190 covers the planarization coating layer 170 and the edge of the first electrode (E1) prepared on the circuit area (CA) except the emission area (EA) in each sub area (SA1, SA2, SA3, and SA4). The bank layer 190 may be formed of an organic material, for example, benzocyclobutene-based resin, acryl-based resin or polyimide-based resin. The bank layer 190 may be formed of a photosensitive material including a black-colored pigment. In this case, the bank layer 190 functions as a light shielding member.

Each of the second electrode (E2) and the emission layer (EL) of the emission device (ED) is formed on the bank layer 190. That is, the emission layer (EL) is formed on the entire area of the substrate 100 provided with the first electrode (E1) and the bank layer 190, and the second electrode (E2) is provided to cover the emission layer (EL).

The encapsulation layer 200 is formed on the substrate 100 so as to cover the second electrode (E2), that is, the entire pixels. The encapsulation layer 200 protects the thin film transistor and the emission device (ED) from an external shock, and also prevents moisture from being permeated into the light emitting display device.

Selectively, the encapsulation layer 200 may be formed of a filling material for surrounding the entire pixels. In this case, the light emitting display device according to the present disclosure may further include an encapsulation substrate 300 attached to the substrate 100 by the use of filling material. The encapsulation substrate 300 may be formed of a metal material.

Additionally, the light emitting display device according to the present disclosure may further include a polarizing film attached to the rear surface (or light-extraction surface) of the substrate 100. The polarizing film changes the external light, which is reflected by the thin film transistor and/or lines prepared in the pixel, into a circularly-polarized state, to thereby improve visibility and contrast ratio of the light emitting display device.

The light emitting display device according to the present disclosure includes the curve pattern 180-1 and 180-2 prepared in the planarization coating layer 170 overlapping the emission area (EA) of each pixel 12a, 12b 12c and 12d so that the traveling path of the light emitted from the emission device (ED) is changed by the curve pattern 180-1 and 180-2, thereby improving the light-extraction efficiency of each pixel 12a, 12b, 12c and 12d, and furthermore, realizing improved luminance and reduced power consumption. Also, the light emitting display device according to the present disclosure includes the curve pattern 180-1 and 180-2 prepared in the planarization coating layer 170 overlapping the emission area (EA) of each pixel 12a, 12b, 12c and 12d, wherein the curve pattern 180-1 and 180-2 includes the plurality of protruding portion 181 and 185 which have the same shape or have the aspect ratio of 0.4 to 0.6, to thereby maximize the light-extraction efficiency of each pixel 12a, 12b, 12c and 12d.

Figure 5:
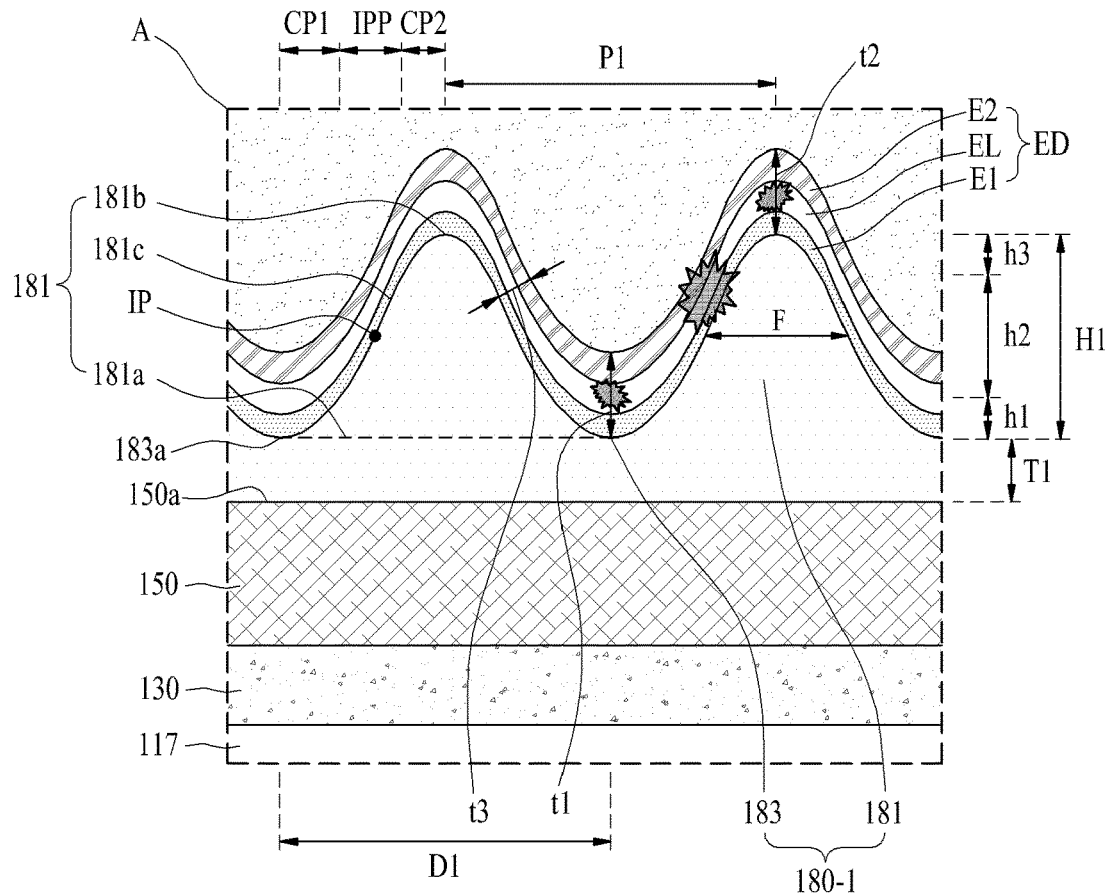
FIG. 5 is an enlarged view showing 'A' portion shown in FIG. 3.
Figure 6:
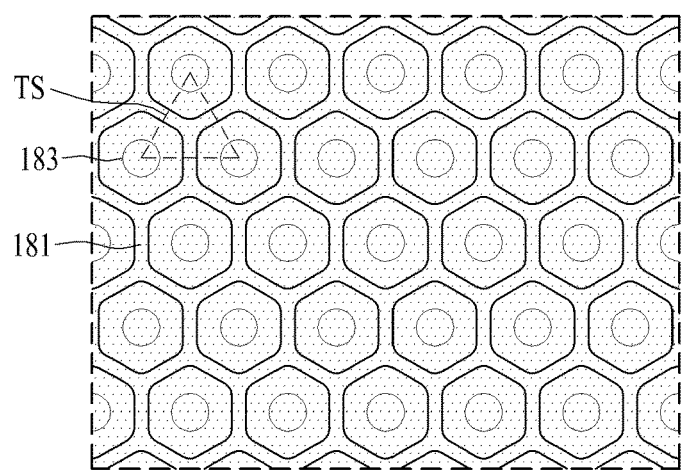
FIG. 6 is a plane view illustrating a plane structure of a first curve pattern shown in FIG. 3.

FIG. 5 is an enlarged view showing 'A' portion shown in FIG. 3, which illustrates a cross sectional structure of the emission device and the first curve pattern according to one aspect of the present disclosure. FIG. 6 is a plane view illustrating a plane structure of the first curve pattern shown in FIG. 3.

Referring to FIGS. 5 and 6 in connection with FIG. 3, the first curve pattern 180-1 according to one aspect of the present disclosure includes the plurality of first protruding portions 181 and the plurality of first recess portions 183.

Each of the plurality of first protruding portions 181 may be formed in the protruding shape on the color filter layer 150. Accordingly, the plurality of first protruding portions 181 may have the cross sectional structure of convex lens or micro lens shape. The plurality of first protruding portions 181 change the traveling path of the incident light which is emitted from the emission device (ED) to the substrate 100, to thereby improve the light-extraction efficiency of the pixel.

The plurality of first protruding portions 181 may be disposed in a hexagonal band type on the plane. In this disclosure, the plurality of first protruding portions 181 may be disposed in various shapes, for example, a circle band shape, an oval band shape or a polygonal band shape on the plane.

Each of the plurality of first protruding portions 181 has a cross sectional area which is parallel to the color filter layer 150. The cross sectional area in each of the plurality of first protruding portions 181 is gradually increased as being close to the color filter layer 150 so as to improve the light-extraction efficiency of the pixel by changing the traveling path of the incident light.

Each of the plurality of first protruding portions 181 according to one aspect of the present disclosure may include a bottom portion 181a, an apex portion 181b and a lateral (side) portion 181c.

The bottom portion 181a may be defined as the bottom surface of the first protruding portion 181 which is adjacent to the color filter layer 150. That is, the bottom portion 181a may be provided at an interval of 0.1 to 0.3 micrometer from the front surface of the color filter layer 150. That is, the bottom portion 181a may be the front surface of the planarization coating layer 170 prepared between the first curve pattern 180-1 and the color filter layer 150.

The diameter (D1, or width) of the bottom portion 181a may be set in accordance with the aspect ratio of the first protruding portion 181 on the basis of bottom diameter and height (H1) of the first protruding portion 181 within a size range which is relatively larger than the apex portion 181b.

The adjacent bottom portions 181a of the first protruding portions 181 are connected with each other so that it is possible to form the first recess portion 183, that is, bottom surface 183a of the first recess portion 183. In this case, a pitch (P1) between the adjacent first protruding portions 181 may be set to be identical to the diameter (D1, or width) of the bottom portion 181a.

The apex portion 181b is provided at a predetermined height from the bottom portion 181a. The apex portion 181b may be defined as the apex of the first protruding portion 181 having the protruding shape. In this case, the apex portion 181b may be disposed in the front surface 170a of the planarization coating layer 170 or under the front surface 170a of the planarization coating layer 170.

The lateral portion 181c is prepared between the bottom portion 181a and the apex portion 181b.

The lateral portion 181c according to one aspect of the present disclosure may be provided in the curved-line shape between the bottom portion 181a and the apex portion 181b so as to improve the light-extraction efficiency of the pixel by changing the traveling path of the incident light. In this case, the lateral portion 181c may have the curve-line shape including an inflection point (IP) so as to maximize the light-extraction efficiency of the pixel. In this case, the lateral portion 181c according to the present disclosure may include an inflection point portion (IPP) having the inflection point (IP), a first curved-line portion (CP1) prepared between the inflection point portion (IPP) and the bottom portion 181a, and a second curved-line portion (CP2) prepared between the inflection point portion (IPP) and the apex portion 181b.

The inflection point portion (IPP) includes a recess surface prepared between the inflection point (IP) and the first curved-line portion (CP1), and a protruding surface prepared between the inflection point (IP) and the second curved-line portion (CP2). Accordingly, the traveling path of the light which is incident on the inflection point portion (IPP) may be changed to various angles by the use of recess surface and protruding surface, to thereby improve the light-extraction efficiency of the pixel.

The first curved-line portion (CP1) may be provided in the recess shape while being disposed between the inflection point portion (IPP) and the bottom portion 181a. The second curved-line portion (CP2) may be provided in the protruding shape while being disposed between the inflection point portion (IPP) and the apex portion 181b.

With respect to the height (H1) of the first protruding portion 181, a ratio of the height (h1) of the first curved-line portion (CP1), the height (h2) of the inflection point portion (IPP) and the height (h3) of the second curved-line portion (CP2) may be set to 1:3:1, but not limited thereto. Each of the height (h1) of the first curved-line portion (CP1) and the height (h3) of the second curved-line portion (CP2) may be the same as or different from each other within a range which is lower than the height (h2) of the inflection point portion (IPP). Also, with respect to the length of the lateral portion 181c, the curved-line length of the inflection point portion (IPP) may be larger than the length of each of the first curved-line portion (CP1) and the second curved-line portion (CP2), and each length of the first curved-line portion (CP1) and the second curved-line portion (CP2) may be the same as or different from each other. In this case, the length of the second curved-line portion (CP2) may be larger than the length of the first curved-line portion (CP1). The height or curved-line length in each of the first curved-line portion (CP1), the inflection point portion (IPP) and the second curved-line portion (CP2) may be set in accordance with the aspect ratio of the first protruding portion 181 which is set so as to improve the light-extraction efficiency in accordance with the change of light traveling path.

The inflection point portion (IPP), the first curved-line portion (CP1) and the second curved-line portion (CP2) in the lateral portion 181c according to one aspect of the present disclosure may have a symmetric structure with respect to the apex portion 181b so that the protruding portions 181 according to one aspect of the present disclosure may have a cross sectional structure of bell or Gaussian curve.

The plurality of first recess portions 183 are prepared at fixed intervals while being prepared in the recess shape from the front surface 170a of the planarization coating layer 170. That is, each of the first recess portions 183 may be prepared in the first protruding portion 181 having the hexagonal band shape on the plane. Accordingly, the first protruding portions 181 and the first recess portions 183 prepared on the emission area (EA) may have a honeycomb structure of a hexagonal shape on the plane.

The plurality of first recess portions 183 are disposed at fixed intervals while being parallel in a first direction, and are provided as a zigzag type in a second direction. That is, the plurality of first recess portions 183 may be disposed at fixed intervals while being provided in a lattice configuration, however, the first recess portions 183 which are adjacent in the first direction may be disposed alternately in the second direction. Accordingly, the respective centers of the adjacent three recess portions 183 may form a triangular shape (TS).

With respect to the front surface 170a of the planarization coating layer 170, the plurality of first recess portions 183 may have the same depth. However, some among the plurality of first recess portions 183 may have the different depths due to a manufacturing error for a patterning process.

The bottom surface (or lowermost surface) in each of the plurality of first recess portions 183 is provided at a predetermined interval from the color filter layer 150. That is, the bottom surface 183a of the first recess portion 183 confronts the front surface 150a of the color filter layer 150 under the circumstances that the planarization coating layer 170 is disposed in-between. In this case, the planarization coating layer 170 prepared between the bottom surface of the first recess portion 183 and the color filter layer 150 has a thickness more than 0.1 micrometer (μm) so as to prevent some of the front surface of the color filter layer 150 from being directly exposed to the first recess portion 183 for a process of forming the first recess portion 183. Herein, as the planarization coating layer 170 prepared between the color filter layer 150 and the first recess portions 183 for a process of forming the first recess portions 183 is increased in its thickness, it is possible to prevent some of the front surface 150a of the color filter layer 150 from being directly exposed to the first recess portion 183 with high efficiency. However, in aspect of the manufacturing process, a material cost of the planarization coating layer 170 is increased, a manufacturing time is increased, and a thickness of the light emitting display device is also increased. Thus, in order to prevent the front surface of the color filter layer 150 from being directly exposed to the first recess portion 183 by the depth of the first recess portion 183, and also to minimize the increase of the material cost in the planarization coating layer 170, the increase of manufacturing time, and the increase of the thickness in the light emitting display device, a maximum thickness of the planarization coating layer 170 prepared between the color filter layer 150 and the bottom surface of the first recess portion 183 is set to be less than 3 micrometer (μm). Accordingly, a minimum distance between the front surface 150a of the color filter layer 150 and the plurality of first recess portions 183 may be 0.1 micrometer (μm), and a maximum distance between the front surface 150a of the color filter layer 150 and the plurality of first recess portions 183 may be 3 micrometer (μm).

If the minimum distance between the color filter layer 150 and the first recess portions 183 is less than 0.1 micrometer (μm), some of the front surface of the color filter layer 150 may be removed and recessed for the patterning process of the planarization coating layer 170 so as to form the first curve pattern 180-1, or some of the front surface of the color filter layer 150 may be directly exposed to the first recess portion 183. If the color filter layer 150 is exposed to the first recess portion 183 without being covered by the planarization coating layer 170, dark spots may be generated in the recess area of the color filter layer 150. Thus, moisture may spread to the emission device (ED) due to moisture by outgassing of the color filter layer 150, to thereby deteriorate the characteristics of the emission device (ED), and reliability and lifespan of the emission device (ED). Also, the first electrode (E1) of the emission device (ED) is in the direct contact with the color filter layer 150, whereby the first electrode (E1) is deteriorated, and the color filter layer 150 is damaged due to the deterioration of the first electrode (E1). If the color filter layer 150 is exposed to the first recess portion 183 without being covered by the planarization coating layer 170, the characteristics of the emission device (ED), and reliability and lifespan of the emission device (ED) may be deteriorated. In order to overcome these problems, the thickness (T1) of the planarization coating layer 170 prepared between the front surface 150a of the color filter layer 150 and the bottom surface 183a of each of the plurality of first recess portions 183 is set within a range of 0.1 to 3 micrometer (μm).

The emission device (ED) according to one aspect of the present disclosure includes the first electrode (E1), the emission layer (EL) and the second electrode (E2) sequentially deposited on the first curve pattern 180-1. The emission device (ED) may have the shape corresponding to the shape of the first protruding portions 181 and the first recess portions 183 prepared in the first curve pattern 180-1. Accordingly, the traveling path of the light emitted from the emission device (ED) is changed to the substrate 100 by the use of first curve pattern 180-1, to thereby improve the light-extraction efficiency.

The thickness of the emission device (ED) according to the present disclosure may be changed in accordance with its location in the first protruding portion 181 and the first recess portion 183. In detail, for a process of forming the emission device (ED) by a deposition method, a deposition material for the emission device (ED), which has straightness, is deposited on the first curve pattern 180-1 instead of a flat surface. Thus, the emission device (ED) may have the different thicknesses (t1, t2, t3) in the apex portion 181b of the first protruding portion 181, the inflection point portion (IPP), and the first recess portion 183. That is, each of the apex portion 181b of the first protruding portion 181 and the bottom surface 183a of the first recess portion 183 may have a large curvature with respect to the inflection point portion (IPP) of the first protruding portion 181, or may have a small inclination with respect to the bottom surface 181a of the first protruding portion 181. Accordingly, the emission device (ED) may have the first thickness (t1) on the bottom surface 183a of the first recess portion 183, may be the second thickness (t2) on the apex portion 181b of the first protruding portion 181, wherein the second thickness (t2) may be the same as or different from the first thickness (t1), and may have the third thickness (t3) on the inflection point portion (IPP) of the first protruding portion 181, wherein the third thickness (t3) may be smaller than each of the first thickness (t1) and the second thickness (t2).

If the emission layer (EL) of the emission device (ED) is formed of an organic light emitting layer, the light emission of the emission layer (EL) is generally generated in the area with high current density. In case of the emission device (ED) according to the present disclosure, a relatively-strong main emission is generated in the emission layer (EL) on the inflection point portion (IPP) of the first protruding portion 181 having the relatively-small third thickness (t3), a first sub emission which is weaker than the main emission is generated in the emission layer (EL) on the bottom surface 183a of the first recess portion 183 having the first thickness (t1) which is relatively larger than the third thickness (t3), and a second sub emission which is weaker than the main emission is generated in the emission layer (EL) on the apex portion 181b of the first protruding portion 181 having the second thickness (t2) which is relatively larger than the third thickness (t3). According to the shape of the first curve pattern 180-1, the main emission area may be defined as a main light-extraction area, and the sub emission area may be defined as a sub light-extraction area. Thus, in case of luminance on the first curve pattern 180-1, while the luminance is relatively high in the area overlapping the inflection point portion (IPP) of the first protruding portion 181, the luminance is relatively low in the area overlapping the bottom surface 183a of the first recess portion 183.

In consideration of the thickness of the emission device (ED) formed in accordance with the shape of the first curve pattern 180-1, the apex portion 181b of the first protruding portion 181 corresponds to the sub emission area, which has the high light-extraction efficiency and low current density. The bottom surface 183a of the first recess portion 183 corresponds to the sub emission area, which has the lowest light-extraction efficiency and the lowest current density. Meanwhile, the inflection point portion (IPP) of the first protruding portion 181 corresponds to the main emission area, which has the high light-extraction efficiency and high current density. Accordingly, with respect to an emission amount of the emission device (ED) for each unit area, the inflection point portion (IPP) of the first protruding portion 181 has the largest emission amount, the bottom surface 183a of the first recess portion 183 has the smallest emission amount, and the emission amount on the apex portion 181b of the first protruding portion 181 may be the same as or larger than the emission amount on the bottom surface 183a of the first recess portion 183. Accordingly, in case of the lateral portion 181c of the first protruding portion 181, the light-extraction efficiency may be increased in accordance with the increase of an occupying percentage of the inflection point portion (IPP), and the power consumption may be reduced in accordance with the decrease of an occupying percentage of the first curved-line portion (CP1). With respect to the height (H1) of the first protruding portion 181, a ratio of the height (h1) of the first curved-line portion (CP1), the height (h2) of the inflection point portion (IPP) and the height (h3) of the second curved-line portion (CP2) may be set to 1:3:1, to thereby improve the light-extraction efficiency.

The first curve pattern 180-1 according to one aspect of the present disclosure may be manufactured by a photolithography process. For example, the process of forming the first curve pattern 180-1 may include steps of coating photoresist at a constant thickness onto the planarization coating layer 170, patterning the curve shape in the planarization coating layer 170 by photolithography, and forming the first curve pattern 180-1 having the plurality of first protruding portions 181 and the plurality of first recess portions 183. An exposure mask used for the photolithography process includes a plurality of light transmitting parts and a plurality of light blocking parts in accordance with the first curve pattern 180-1. In this case, the shape in each of the plurality of light transmitting parts is set within a range capable of preventing the exposure of the color filter layer 150 on the basis of the thickness of the planarization coating layer 170 on the color filter layer 150, the exposure amount, the diameter of the first protruding portion 181, and the pitch between the first protruding portions 181.

The first curve pattern 180-1 according to another aspect of the present disclosure may be manufactured by a photolithography process and a heat-treatment process. For example, the process of forming the first curve pattern 180-1 may include steps of coating photoresist at a constant thickness onto the planarization coating layer 170, patterning the curve shape in the planarization coating layer 170 by photolithography, forming the first curve pattern 180-1 having the plurality of first protruding portions 181 and the plurality of first recess portions 183, and realizing the optimal shape of the first protruding portions 181 by the heat-treatment process. In this case, the heat-treatment process is carried out by at least two steps instead of one step. For example, the heat-treatment process may include a first heat-treatment process using a first heat-treatment temperature, and a second heat-treatment process using a second heat-treatment temperature which is relatively higher than the first heat-treatment temperature. Herein, the shape of the first protruding portions 181 may be determined by controlling the process time and the first heat-treatment temperature of the first heat-treatment process.

The light-extraction efficiency in accordance with the shape of the first curve pattern 180-1 may be influenced by the aspect ratio of the first protruding portion 181 based on the diameter (D1) and the height (H1) of the first protruding portion 181. Herein, the aspect ratio (H/(D/2)) of the first protruding portions 181 may be defined as the value obtained by dividing the height (H1) of the first protruding portion 181 by the radius (D1/2) of the bottom portion 181a. The first protruding portions 181 of the first curve pattern 180-1 according to the present disclosure may have the aspect ratio of 0.4~0.6.

If the aspect ratio of the first protruding portions 181 is within the range of 0.4~0.6, it is possible to improve the light-extraction efficiency in comparison to the case where the aspect ratio of the first protruding portions 181 is less than 0.4 or more than 0.6. That is, if the aspect ratio of the first protruding portions 181 is less than 0.4, the height (H1) of the first protruding portions 181 become too low so that the light emitted from the emission device (ED) does not travel toward the substrate 100, that is, the light is caught inside the emission device (ED), thereby lowering the light-extraction efficiency. Meanwhile, if the aspect ratio of the first protruding portions 181 is more than 0.6, the height (H1) of the first protruding portions 181 become too high so that the light reflectance is increased, thereby lowering the light-extraction efficiency. Especially, if the aspect ratio of the first protruding portions 181 is more than 0.6, it shows a tendency of lowering the rise of current efficiency. However, if the aspect ratio of the first protruding portions 181 is within the range of 0.4~0.6, it has the maximum value in the rise of current efficiency of the emission device (ED). The aspect ratio of the first protruding portions 181 may be within the range of 0.4~0.6 so as to maximize the light-extraction efficiency of the pixel.

If the aspect ratio of the first protruding portions 181 is within the range of 0.4~0.60.6, on the basis of resolution of a mask for patterning the first curve pattern 180-1, the diameter (D1) of the bottom portion 181a may be set to be 4~12 micrometer (μm), and the height (H1) of the bottom portion 181a may be set to be 0.8~3.6 micrometer (μm). In this case, when the diameter (D1) of the bottom portion 181a may be set to 4 micrometer (μm), and the height (H1) of the first protruding portions 181 may be set to 0.8 micrometer (μm), the aspect ratio of the first protruding portions 181 may be 0.4. Also, when the diameter (D1) of the bottom portion 181a may be set to 12 μm, and the height (H1) of the first protruding portions 181 may be set to 3.6 micrometer (μm), the aspect ratio of the first protruding portions 181 may be 0.6.

If the height (H1) of the first protruding portions 181 is less than 0.8 micrometer (μm), the height of the first protruding portions 181 becomes too low so that the aspect ratio is reduced. Accordingly, the first curve pattern 180-1 is planarized so that the light emitted from the emission device (ED) is caught inside the emission device (ED), thereby reducing the light amount extracted toward the substrate 100. If the height (H1) of the first protruding portions 181 is more than 3.6 micrometer (μm), the height of the first protruding portions 181 becomes too high so that the aspect ratio is increased, thereby lowering the current efficiency rise, and increasing the reflectance.

If the diameter (D1) of the bottom portion 181a of the first protruding portions 181 is less than 4 micrometer (μm), it is difficult to control the patterning process. If the diameter (D1) of the bottom portion 181a of the first protruding portions 181 is more than 12 micrometer (μm), it causes the excess of the optimal height (H1) in the first protruding portions 181, that is, 3.6 micrometer (μm), thereby lowering productivity.

Additionally, the emission device (ED) deposited in the first protruding portions 181 may have the maximum emission amount at its maximum inclination. Accordingly, if the emission device (ED) has the maximum inclination at the lateral portion 181c or the inflection point portion (IPP) with respect to the bottom portion 181a of the first protruding portions 181, the light emitted from the emission device (ED) may travel at an angle which is smaller than the total-reflection critical angle, whereby the external emission efficiency is improved by a multi-reflection, to thereby realizing the maximum external light extraction efficiency.

The inclination at the lateral portion 181c or the inflection point portion (IPP) of the first protruding portions 181 may be determined by a half-height aspect ratio (H1/F) to the aspect ratio of the first protruding portions 181. Herein, the half-height aspect ratio (H1/F) indicates the ratio of the height (H1) to the half-height width (F) of the first protruding portion 181, wherein the half-height width (F) indicates the width in the half (H1/2) of the height (H1).

If the aspect ratio of the first protruding portions 181 is within the range of 0.4~0.6, the he half-height aspect ratio (H1/F) of the first protruding portions 181 may be within the range of 0.45~0.7. Herein, if the half-height aspect ratio (H1/F) of the first protruding portions 181 is less than 0.45, the height (H1) of the first protruding portions become too low so that the light emitted from the emission device (ED) does not travel toward the substrate 100, that is, the light is caught inside the emission device (ED), thereby lowering the light-extraction efficiency. Meanwhile, if the half-height aspect ratio (H1/F) of the first protruding portions 181 is more than 0.7, the height (H1) of the first protruding portions 181 become too high so that the light reflectance is increased, thereby lowering the light-extraction efficiency.

In the first curve pattern 180-1 according to the present disclosure, the first protruding portions 181 have the aspect ratio of 0.4~0.6 so that the light-extraction efficiency may be improved in the first to third pixels, and the first protruding portions 181 have the half-height aspect ratio (H1/F) of 0.45~0.7 so that it is possible to maximize the light-extraction efficiency of the first to third pixels.

Figure 7:
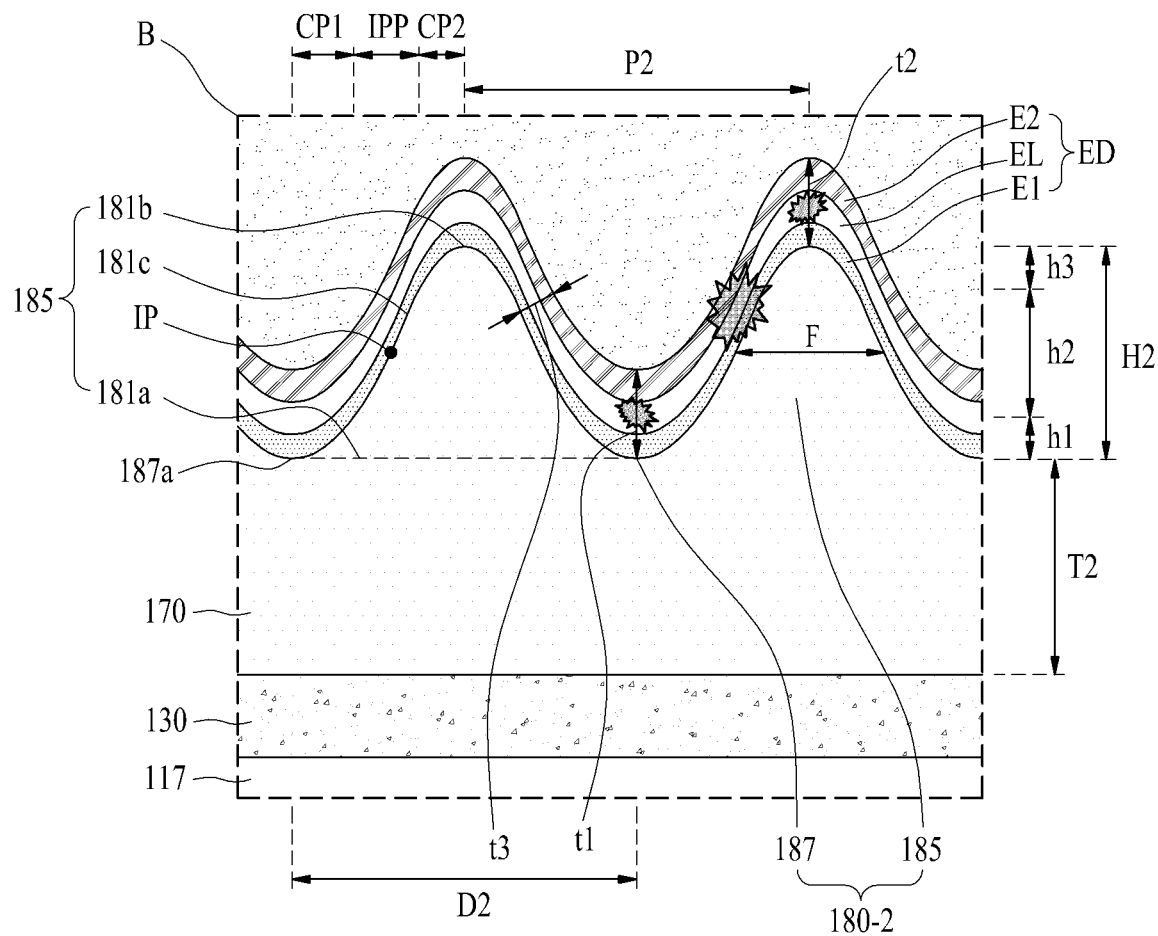
FIG. 7 is an enlarged view illustrating 'B' portion shown in FIG. 4.

FIG. 7 is an enlarged view illustrating 'B' portion shown in FIG. 4, which illustrates a cross sectional structure of the second curve pattern and the emission device according to one aspect of the present disclosure.

Referring to FIG. 7 in connection with FIG. 4, the second curve pattern 180-2 according to one aspect of the present disclosure includes the plurality of second protruding portions 185 and the plurality of second recess portions 187 prepared on the front surface 170a of the planarization coating layer 170 prepared on the insulating layer 130.

Each of the plurality of second protruding portions 185 may be formed in the protruding shape on the insulating layer 130. Accordingly, the plurality of second protruding portions 185 may have the cross sectional structure of convex lens or micro lens shape.

Each of the plurality of second protruding portions 185 has the aspect ratio (H2/(D2/2)) of 0.4~0.6 so that the light-extraction efficiency of the fourth pixel is the same as the light-extraction efficiency of each of the first to third pixels. In the same manner as the first protruding portion 181, each of the plurality of second protruding portions 185 includes a bottom portion 181a, an apex portion 181b and a lateral portion 181c, whereby a detailed description for the same parts will be omitted. The plurality of second protruding portions 185 change the traveling path of the incident light which is emitted from the emission device (ED) to the substrate 100, to thereby improve the light-extraction efficiency of the fourth pixel.

The plurality of second recess portions 187 are prepared at fixed intervals while being prepared in the recess shape from the front surface 170a of the planarization coating layer 170. Except that a bottom surface 187a of each of the plurality of second recess portions 187 is provided at a predetermined interval from the insulating layer 130, the plurality of second recess portions 187 are identical in shape to the plurality of first recess portions 183, whereby a detailed description for the plurality of second recess portions 187 will be omitted.

In the second curve pattern 180-2 according to the present disclosure, the second protruding portions 185 have the aspect ratio of 0.4~0.6 so that the light-extraction efficiency may be improved in the fourth pixel, and the second protruding portions 185 have the half-height aspect ratio (H2/F) of 0.45~0.7 so that it is possible to maximize the light-extraction efficiency of the fourth pixel.

Eventually, in case of the light emitting display device according to the present disclosure, the first curve pattern prepared in the emission area of each of the first to third pixels, and the second curve pattern prepared in the emission area of the fourth pixel include the protruding portions having the aspect ratio of 0.4~0.6 so that it is possible to improve the light-extraction efficiency in the respective pixels constituting the unit pixel, and furthermore, to maximize the light-extraction efficiency in the respective pixels constituting the unit pixel.

Figure 8A:
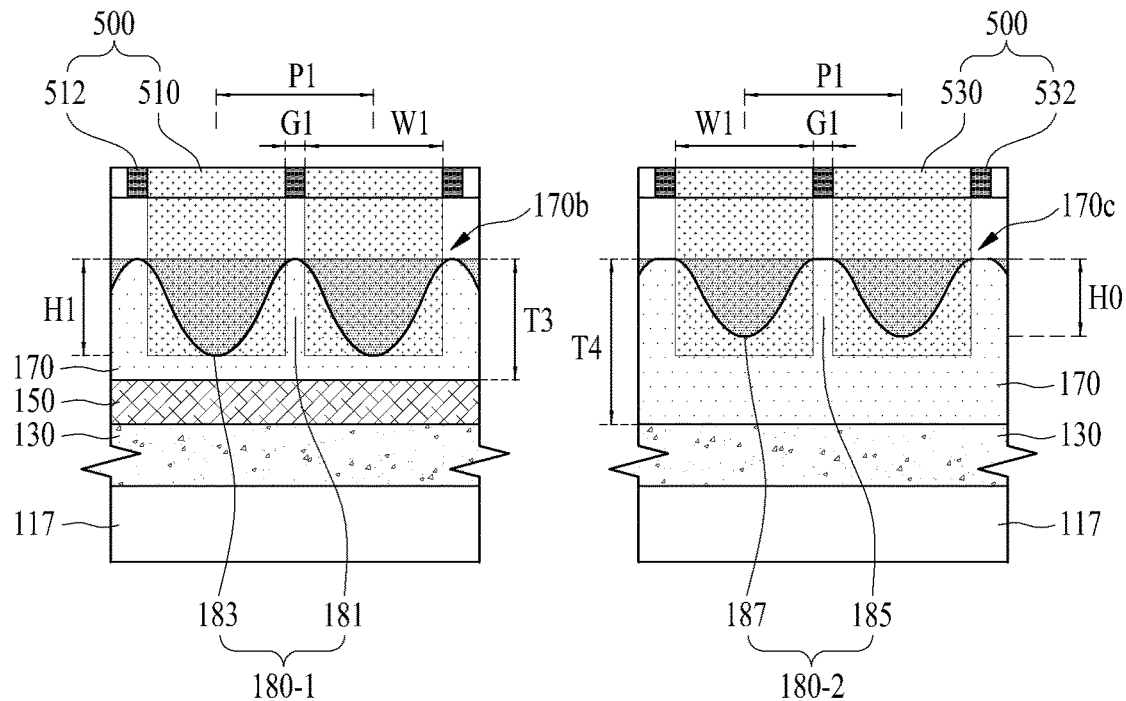
FIGS. 8A to 8C illustrate a mask structure for forming first and second curve patterns in the light emitting display device according to the present disclosure.
Figure 8B:
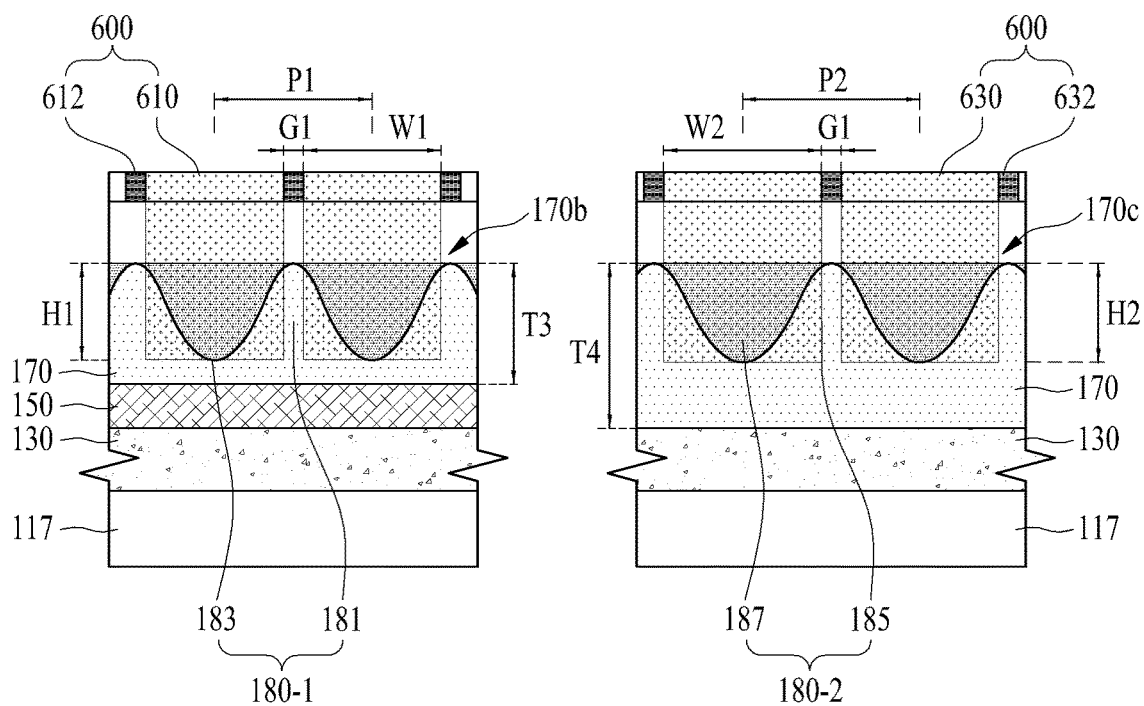
Figure 8C:
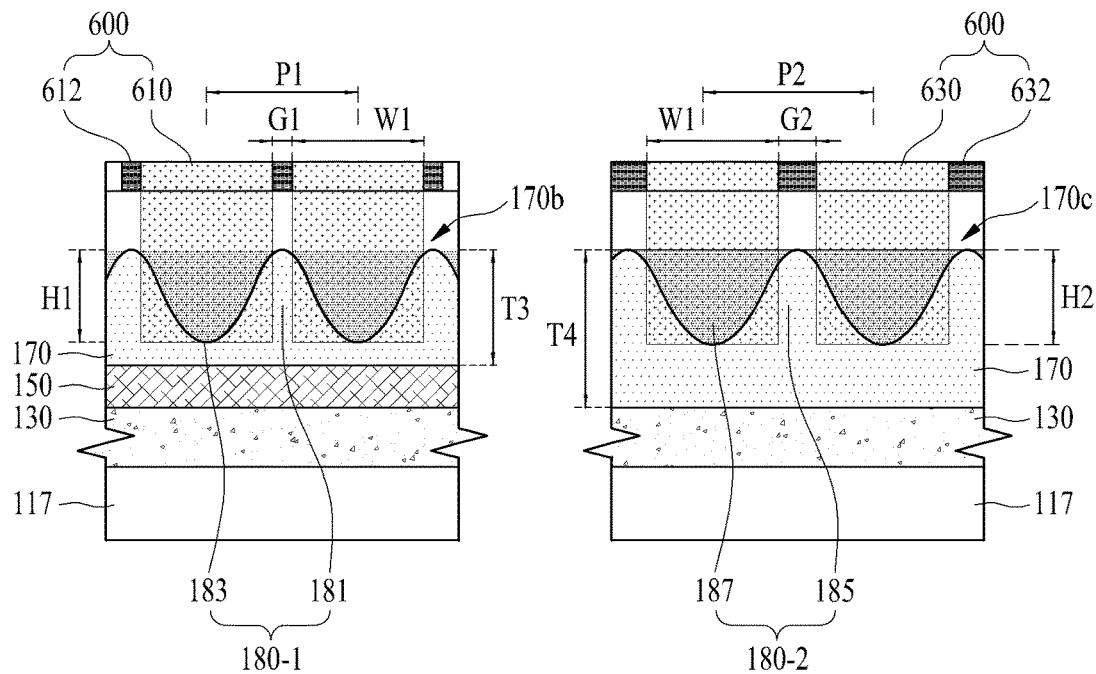

FIGS. 8A to 8C illustrate a mask structure for forming the first curve pattern and the second curve pattern in the light emitting display device according to the present disclosure.

First, referring to FIG. 8A, a first exposure mask 500 for forming the first curve pattern 180-1 and the second curve pattern 180-2 includes a plurality of first light transmitting portions 510 for transmitting the incident light through a first area 170b of the planarization coating layer 170 to be provided with the first curve pattern 180-1, a plurality of first light blocking portions 512 prepared between each of the plurality of first light transmitting portions 510, a plurality of second light transmitting portions 530 for transmitting the incident light through a second area 170c of the planarization coating layer 170 to be provided with the second curve pattern 180-2, and a plurality of second light blocking portions 532 prepared between each of the plurality of second light transmitting portions 530.

In the first exposure mask 500, a pitch (P1) of the first light transmitting portion 510 corresponding to a distance between central points of the adjacent first light transmitting portions 510 is the same as a pitch (P1) of the second light transmitting portion 530 corresponding to a distance between central points of the adjacent second light transmitting portions 530, and a width (W1, or diameter) in each of the plurality of first light transmitting portions 510 is the same as a width (W1, or diameter) in each of the plurality of second light transmitting portions 530. Also, a width (G1, or gap) in each of the plurality of first light blocking portions 512 is the same as a width (G1, or gap) in each of the plurality of second light blocking portions 532. The pitch (P1) and width (W1) of the first and second light transmitting portions 510 and 530 and the width (G1) of the first and second light blocking portions 512 and 532 may be set within a range capable of spacing the bottom surface of the recess portion 183 of the first curve pattern to be provided with the planarization coating layer 170 at a distance of 0.1 to 3 micrometer (μm) from the color filter layer 150.

According as the photolithography process using the first exposure mask 500 is carried out, the first and second curve patterns 180-1 and 180-2 having the plurality of protruding portions and the plurality of recess portions are respectively formed in the first area 170b and the second area 170c of the planarization coating layer 170.

However, for an exposure process of the photolithography process, the second protruding portions 185 of the second curve pattern 180-2 are formed in the relatively thick second area 170c of the planarization coating layer 170 due to the absence of the color filter layer 150, whereby the height (H0) in the second protruding portions 185 of the second curve pattern 180-2 is relatively lower than the height (H1) in the first protruding portions 181 of the first curve pattern 180-1. That is, in case of the planarization coating layer 170, the second area 170c is formed on the insulating layer 130 which is not provided with the color filter layer 150, whereby a thickness (T4) of the second area 170c is relatively greater than a thickness (T3) of the first area 170b formed on the color filter layer 150. Accordingly, the light irradiated onto the second area 170c for the exposure process is dispersed so that the height (H0) of the second protruding portions 185 formed in the second area 170c is lower than the height (H1) of the first protruding portions 181. Thus, the second protruding portions 185 may have the aspect ratio less than 0.4 due to the low height (H0). If the first curve pattern 180-1 and the second curve pattern 180-2 are formed on the planarization coating layer 170 by the use of first exposure mask 500, the light-extraction efficiency in the fourth pixel is relatively lower than the light-extraction efficiency in the first to third pixels due to the height difference (H1, H0) between the protruding portions 181 of the first curve pattern 180-1 and the protruding portions 185 of the second curve pattern 180-2.

Next, referring to FIG. 8B, a second exposure mask 600 for forming the first curve pattern 180-1 and the second curve pattern 180-2 may include first light transmitting portions 610, first light blocking portions 612, second light transmitting portions 630 and second light blocking portions 632, in the same manner as the first exposure mask 500. However, the first light transmitting portions 610 and the second transmitting portions 630 have the different pitches (P1, P2) from each other.

In the second exposure mask 600 according to one aspect of the present disclosure, the second pitch (P2) in the second light transmitting portions 630 is larger than the first pitch (P1) in the first light transmitting portions 610. To this end, a second width (W2, or diameter) in the second light transmitting portions 630 is larger than a first width (W1, or diameter) in the first light transmitting portions 610, and a second width (G2, or gap) in the second light blocking portions 632 is the same as a first width (G1, or gap) in the first light blocking portions 612. That is, in comparison to the first exposure mask 500, the second width (W2, or diameter) of the second light transmitting portions 630 in the second exposure mask 600 is increased so that the second pitch (P2) of the second light transmitting portions 630 in the second exposure mask 600 may be increased. The second width (W2, or diameter) of the second light transmitting portions 630 is set within the range capable of obtaining the same aspect ratio and the same half-height aspect ratio both in the first protruding portions 181 and the second protruding portions 185 formed in the second area 170c of the planarization coating layer 170. That is, the second width (W2, or diameter) of the second light transmitting portions 630 is set within the range enabling the aspect ratio of 0.4~0.6 in the second protruding portions 185, and enabling the half-height aspect ratio of 0.45~0.7 in the second protruding portions 185.

In case of the second exposure mask 600 according to another aspect of the present disclosure, as shown in FIG. 8C, the second pitch (P2) of the second light transmitting portions 630 may be larger than the first pitch (P1) of the first light transmitting portions 610 by increasing the second width (G2, or gap) of the second light blocking portions 632 instead of the second width (W2, or diameter) of the second light transmitting portions 630. That is, the second width (G2, or gap) of the second light blocking portions 632 is larger than the first width (G1, or gap) of the first light blocking portions 612, and the second width (W1, or diameter) of the second light transmitting portions 630 is the same as the first width (W1, or diameter) of the first light transmitting portions 610. That is, in comparison to the first exposure mask 500, the second width (G2, or diameter) of the second light blocking portions 632 in the second exposure mask 600 is increased so that the second pitch (P2) of the second light transmitting portions 630 in the second exposure mask 600 may be increased. The second width (G2, or diameter) of the second light blocking portions 632 is set within the range capable of obtaining the same aspect ratio and the same half-height aspect ratio both in the first protruding portions 181 and the second protruding portions 185 formed in the second area 170c of the planarization coating layer 170. That is, the second width (G2, or diameter) of the second light blocking portions 632 is set within the range enabling the aspect ratio of 0.4~0.6 in the second protruding portions 185, and enabling the half-height aspect ratio of 0.45~0.7 in the second protruding portions 185.

In the second exposure mask 600, the second pitch (P2) of the second light transmitting portions 630 is larger than the first pitch (P1) of the first light transmitting portion 610 so that the aspect ratio of the second protruding portions 185 may be the same the aspect ratio of the first protruding portions 181, and furthermore, the half-height aspect ratio of the second protruding portions 185 may be the same the half-height aspect ratio of the first protruding portions 181.

If the first curve pattern 180-1 and the second curve pattern 180-2 are formed on the planarization coating layer 170 by the use of second exposure mask 600, the protruding portions 181 of the first curve pattern 180-1 and the protruding portions 185 of the second curve pattern 180-2 may have the aspect ratio of 0.4~0.6, and may have the half-height aspect ratio of 0.45~0.7 so that it is possible to uniformity of the light-extraction efficiency in the first to third pixels and the fourth pixel.

Figure 9:
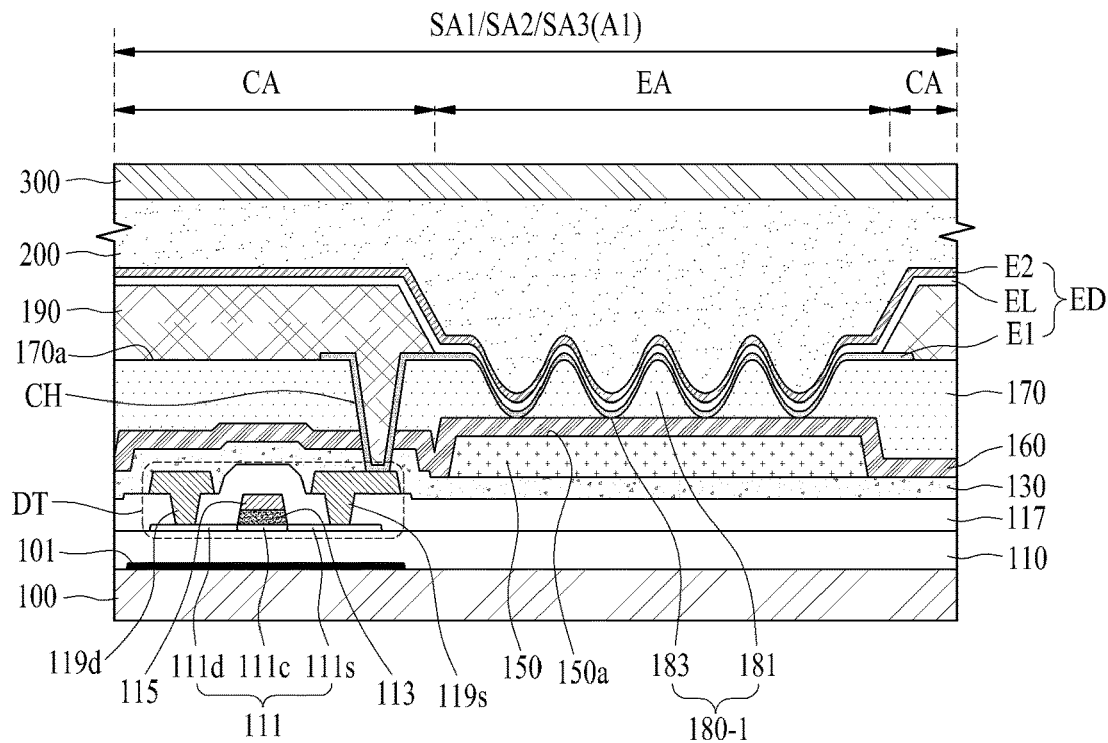
FIG. 9 is a cross-sectional view illustrating a structure of first to third pixels shown in FIG. 1.
Figure 10:
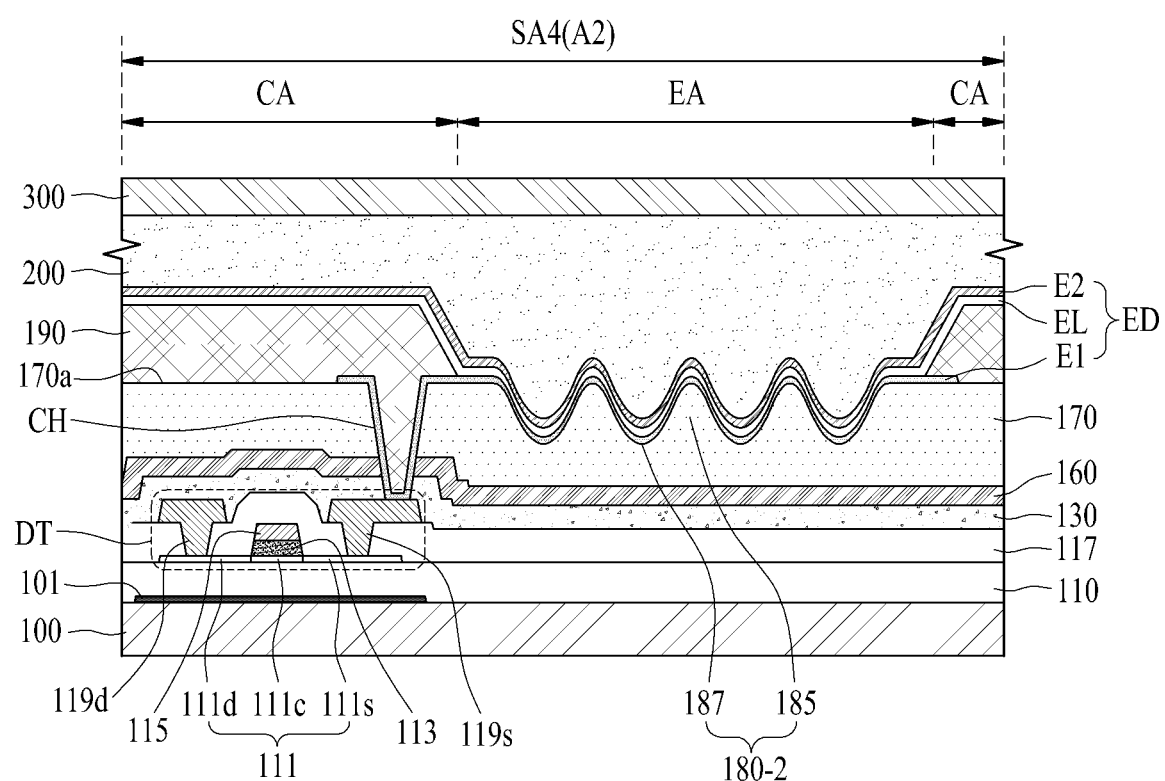
FIG. 10 is a cross-sectional view illustrating a structure of a fourth pixel shown in FIG. 1.

FIG. 9 is a cross-sectional view illustrating a structure of the first to third pixels shown in FIG. 1. FIG. 10 is a cross sectional view illustrating a structure of the fourth pixel shown in FIG. 1, which is obtained by additionally providing a barrier layer to the light emitting display device shown in FIGS. 1 to 7. Hereinafter, a detailed description for the same parts except the barrier layer and related structures will be omitted.

Referring to FIGS. 9 and 10, the barrier layer 160 according to the aspect of the present disclosure is prepared on the substrate 100 so as to cover the color filter layer 150 and the insulating layer 130. That is, the barrier layer 160 is prepared between the planarization coating layer 170 and the color filter layer 150, and between the planarization coating layer 170 and the insulating layer 130. For the process of forming the first and second curve patterns 180-1 and 180-2 in the planarization coating layer 170 overlapping the emission area (EA) of each pixel, the barrier layer 160 functions as an etching stopper so that it is possible to prevent the color filter layer 150 from being directly exposed to the first recess portion 183, to thereby fundamentally prevent the problem caused by the exposure of the color filter layer 150.

The barrier layer 160 according to one aspect of the present disclosure may have a thickness of 0.1 to 3 micrometer (μm). Herein, if the thickness of the barrier layer 160 is less than 0.1 micrometer (μm), particles contained in the color filter layer 150 penetrate through the barrier layer 160, whereby the emission device (ED) may be damaged by the particles of the color filter layer 150. Also, according as the thickness of the barrier layer 160 is increased, it is favorable for preventing the exposure of the color filter layer 150. However, in aspect of the manufacturing process, a material cost of the barrier layer 160 is increased, a manufacturing time is increased, and a thickness of the light emitting display device is also increased. In this reason, the thickness of the barrier layer 160 may be less than 3 micrometer (μm). For example, if the particle of the color filter layer 150 has a size less than 0.1 micrometer (μm), the barrier layer 160 may be formed at a thickness of at least 0.1 micrometer (μμm).

The barrier layer 160 according to one aspect of the present disclosure may be formed of a material which is not removed by a developing material (or etching material) used for the process of patterning the planarization coating layer 170.

The barrier layer 160 according to another aspect of the present disclosure may be formed of an inorganic material such as silicon oxide ($SiO_x$) or silicon nitride ($SiN_x$). That is, the barrier layer 160 may be formed of the same material as that of the insulating layer 130. For example, the barrier layer 160 and the insulating layer 130 may be formed of $SiO_2$.

After forming the first and second curve patterns 180-1 and 180-2, a process for forming the contact hole (CH) so as to expose some of the source electrode 119s of the driving thin film transistor (DT) may be carried out. If the barrier layer 160 and the insulating layer 130 are formed of the same material, in consideration of the process for forming the contact hole (CH), the contact hole (CH) may be formed in the barrier layer 160 and the insulating layer 130 at the same time by one patterning process. For the simplified manufacturing process of the light emitting display device, the barrier layer 160 and the insulating layer 130 may be formed of the same material.

The light emitting display device according to the aspect of the present disclosure facilitates to maximize the light-extraction efficiency of the respective pixels constituting the unit pixel, to prevent the color filter layer 150 from being directly exposed to the first recess portion 183 by the barrier layer 160 functioning as the etching stopper between the first curve pattern 180-1 and the color filter layer 150, and to prevent deterioration of the characteristics of the emission device (ED) caused by the exposure of the color filter layer 150.

According to the present disclosure, the light-extraction efficiency of the pixels prepared in the light emitting display device can be improved, thereby maximizing the light-extraction efficiency in each pixel.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A light emitting display device comprising:
   a substrate having a first area and a second area;
   a coating layer disposed on the substrate and having a plurality of protruding portions in each of the first area and the second area; and
   an emission element disposed on the plurality of protruding portions,
   wherein a pitch between two adjacent protruding portions disposed in the first area is different from a pitch between two adjacent protruding portions disposed in the second area.

2. The light emitting display device of claim 1, wherein a thickness of the coating layer vertically overlapping the first area is different from a thickness of the coating layer vertically overlapping the second area.

3. The light emitting display device of claim 1, wherein the pitch between two adjacent protruding portions disposed in the first area is greater than the pitch between two adjacent protruding portions disposed in the second area.

4. The light emitting display device of claim 1, further comprising:
   red, green and blue subpixels at the first area; and
   a white subpixel at the second area.

5. The light emitting display device of claim 4, wherein the pitch between two adjacent protruding portions disposed in the white subpixel is different from the pitch between two adjacent protruding portions disposed in at least one subpixel of the red, green and blue subpixels.

6. The light emitting display device of claim 1,
   wherein the plurality of protruding portions includes a bottom portion adjacent to the substrate, and an apex portion disposed at a predetermined height from the bottom portion, and
   wherein a thickness of the emission element disposed between the bottom portion and the apex portion of each of the plurality of protruding portions is less than a thickness of the emission element disposed between the bottom portion and/or the apex portion of each of the plurality of protruding portions.

7. The light emitting display device of claim 1,
   wherein the plurality of protruding portions includes a bottom portion adjacent to the substrate, and an apex portion disposed at a predetermined height from the bottom portion, and
   wherein a luminance of the emission element disposed on the apex portion of each of the plurality of protruding portions is greater than a luminance of the emission element disposed on the bottom portion of each of the plurality of protruding portions.

8. The light emitting display device of claim 1, further comprising a color filter layer disposed at the first area between the substrate and the plurality of protruding portions,
   wherein an end of the color filter layer extends pass through an end of an area overlapping the plurality of protruding portions.

9. The light emitting display device of claim 1, further comprising a plurality of recess portions surrounded by the plurality of protruding portions, and
   wherein the plurality of recess portions are arranged in a line along a first direction and a zigzag type along a second direction.

10. The light emitting display device of claim 1, further comprising a plurality of recess portions surrounded by the plurality of protruding portions, and
    wherein the plurality of protruding portions has a honeycomb structure or a hexagonal shape in plan view.

11. A light emitting display device comprising:
    a substrate;
    a pixel disposed on the substrate and including a plurality of subpixels;
    a coating layer disposed on the substrate and having a plurality of protruding portions in each of the plurality of subpixels; and
    an emission element disposed on the plurality of protruding portions,
    wherein a pitch between two adjacent protruding portions disposed in at least one subpixel of the plurality of subpixels is different from a pitch between two adjacent protruding portions disposed in the adjacent subpixels.

12. The light emitting display device of claim 11, wherein the pitch between two adjacent protruding portions disposed in at least one subpixel of the plurality of subpixels is greater than the pitch between two adjacent protruding portions disposed in the adjacent subpixels.

13. The light emitting display device of claim 11,
    wherein the pixel comprise a red subpixel, a green subpixel, a blue subpixel, and a white subpixel, and
    wherein the pitch between two adjacent protruding portions disposed in the white subpixel is different from the pitch between two adjacent protruding portions disposed in at least one subpixel of the red, green and blue subpixels.

14. The light emitting display device of claim 11,
    wherein the pixel comprise a red subpixel, a green subpixel, a blue subpixel, and a white subpixel, and
    wherein the pitch between two adjacent protruding portions disposed in the white subpixel is greater than the pitch between two adjacent protruding portions disposed in at least one subpixel of the red, green and blue subpixels.

15. The light emitting display device of claim 11,
    wherein the pixel comprise a red subpixel, a green subpixel, a blue subpixel, and a white subpixel, and
    wherein a thickness of the coating layer disposed on the white subpixel is different from a thickness of the coating layer disposed on at least one subpixel of the red, green and blue subpixels.

16. The light emitting display device of claim 11,
    wherein the plurality of protruding portions includes a bottom portion adjacent to the substrate, and an apex portion disposed at a predetermined height from the bottom portion, and
    wherein a thickness of the emission element disposed between the bottom portion and the apex portion of each of the plurality of protruding portions is less than a thickness of the emission element disposed between the bottom portion and/or the apex portion of each of the plurality of protruding portions.

17. The light emitting display device of claim 11,
wherein the plurality of protruding portions includes a bottom portion adjacent to the substrate, and an apex portion disposed at a predetermined height from the bottom portion, and
wherein a luminance of the emission element disposed on the apex portion of each of the plurality of protruding portions is greater than a luminance of the emission element disposed on the bottom portion of each of the plurality of protruding portions.

18. The light emitting display device of claim 11, further comprising a color filter layer disposed at the first area between the substrate and the plurality of protruding portions,
wherein an end of the color filter layer extends pass through an end of an area overlapping the plurality of protruding portions.

19. The light emitting display device of claim 11, further comprising a plurality of recess portions surrounded by the plurality of protruding portions, and
wherein the plurality of recess portions are arranged in a line along a first direction and a zigzag type along a second direction.

20. The light emitting display device of claim 11, further comprising a plurality of recess portions surrounded by the plurality of protruding portions, and
wherein the plurality of protruding portions has a honeycomb structure or a hexagonal shape in plan view.

* * * * *